(12) United States Patent
Chuang et al.

(10) Patent No.: US 12,672,578 B2
(45) Date of Patent: Jun. 30, 2026

(54) CAP LAYER FOR PAD OXIDATION PREVENTION

(71) Applicant: Taiwan Semiconductor Manufacturing Company, Ltd., Hsinchu (TW)

(72) Inventors: Harry-Haklay Chuang, Zhubei City (TW); Wei-Cheng Wu, Zhubei City (TW); Chih-Peng Tsai, Changhua County (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 489 days.

(21) Appl. No.: 18/307,165

(22) Filed: Apr. 26, 2023

(65) Prior Publication Data

US 2024/0243080 A1     Jul. 18, 2024

Related U.S. Application Data

(60) Provisional application No. 63/480,354, filed on Jan. 18, 2023.

(51) Int. Cl.
| | |
|---|---|
| *H10W 72/90* | (2026.01) |
| *H10P 74/20* | (2026.01) |
| *H10W 72/00* | (2026.01) |
| *H10W 90/00* | (2026.01) |

(52) U.S. Cl.
CPC ........... *H10W 72/90* (2026.01); *H10P 74/207* (2026.01); *H10W 72/01908* (2026.01); *H10W 72/981* (2026.01); *H10W 90/791* (2026.01)

(58) Field of Classification Search
CPC ..................... H01L 24/05; H01L 24/08; H01L 2224/08135; H01L 24/80; H01L 23/5226; H01L 23/5283; H01L 25/0657; H01L 2224/02215; H01L 2224/03019; H01L 23/53276; H01L 21/768; H01L 23/5223; H01L 2225/06527
See application file for complete search history.

(56) References Cited

U.S. PATENT DOCUMENTS

| | | | |
|---|---|---|---|
| 11,527,500 B2 * | 12/2022 | Sharangpani | H01L 24/03 |
| 11,978,681 B2 * | 5/2024 | Gao | H01L 21/76877 |
| 2002/0021142 A1 | 2/2002 | Iino et al. | |
| 2010/0059887 A1 | 3/2010 | Ueki et al. | |

(Continued)

*Primary Examiner* — Mamadou L Diallo
(74) *Attorney, Agent, or Firm* — Eschweiler & Potashnik, LLC

(57) ABSTRACT

Various embodiments of the present disclosure are directed towards a semiconductor structure (e.g., an integrated circuit (IC) die) comprising an enhanced cap layer for pad oxidation prevention, as well as a method for forming the IC die. An interconnect pad overlies a substrate at a top of an interconnect structure, and a bond structure overlies and extends from a surface of the interconnect pad. A cap layer and an etch stop layer overlie the surface around the bond structure. Further, the cap layer separates the etch stop layer from the interconnect pad and is soft. Soft may for example, refer to a hardness less than silicon nitride and/or less than the etch stop layer. Because the cap layer is soft, a probe may be pushed through the cap layer to the interconnect pad for testing without first forming a pad opening exposing the interconnect pad.

20 Claims, 15 Drawing Sheets

(56)                    References Cited

U.S. PATENT DOCUMENTS

| 2019/0096830 | A1  | 3/2019  | Wei et al. |
| 2021/0066222 | A1* | 3/2021  | Chen ................. H01L 21/76879 |
| 2021/0159215 | A1* | 5/2021  | Wu ..................... H01L 25/0657 |
| 2021/0358846 | A1  | 11/2021 | Wu et al. |
| 2022/0344301 | A1* | 10/2022 | Yu ........................... H01L 24/80 |

* cited by examiner

200A

200B

1800

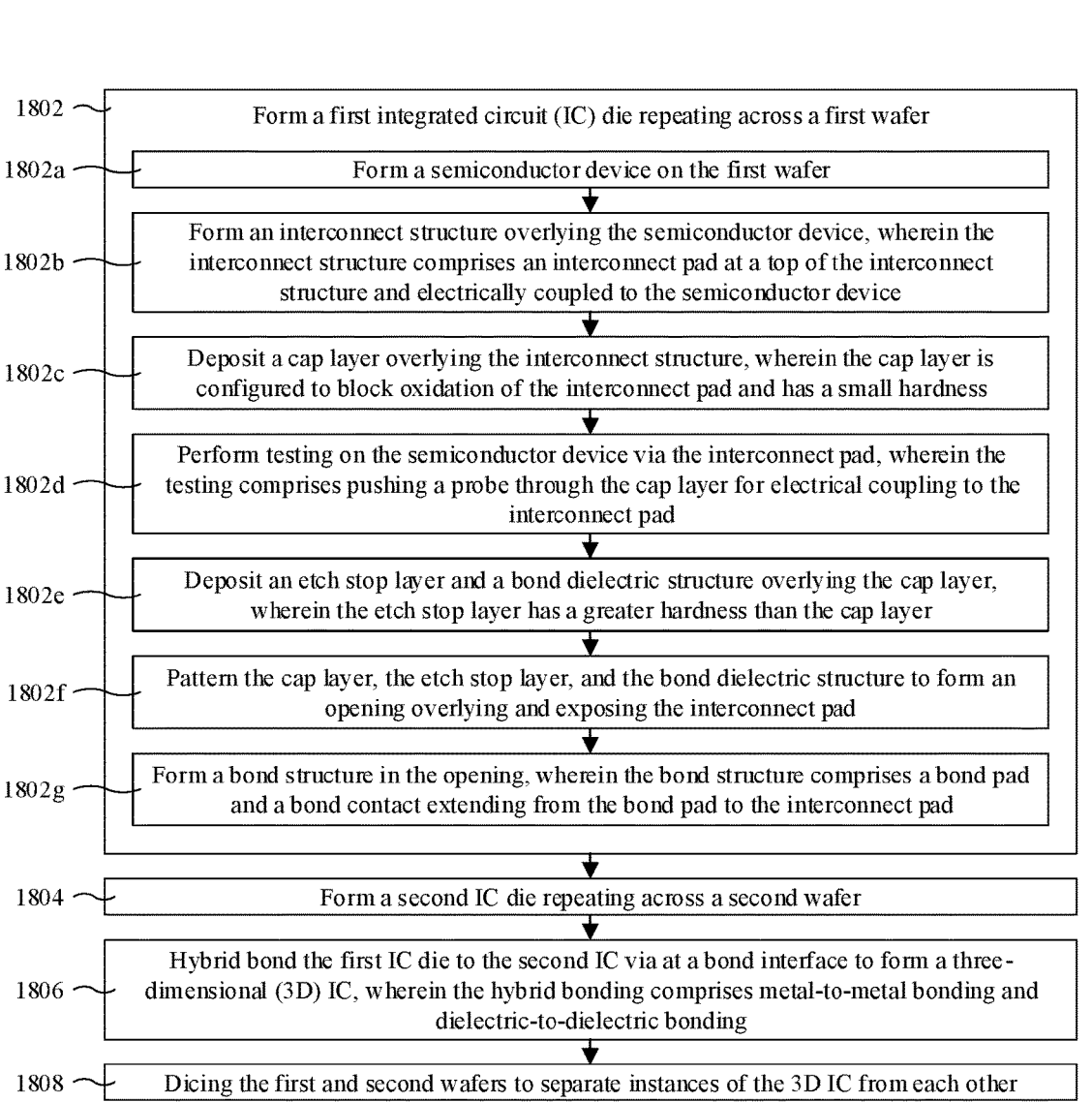

1802 — Form a first integrated circuit (IC) die repeating across a first wafer

1802a — Form a semiconductor device on the first wafer

1802b — Form an interconnect structure overlying the semiconductor device, wherein the interconnect structure comprises an interconnect pad at a top of the interconnect structure and electrically coupled to the semiconductor device 1802c — Deposit a cap layer overlying the interconnect structure, wherein the cap layer is configured to block oxidation of the interconnect pad and has a small hardness 1802d — Perform testing on the semiconductor device via the interconnect pad, wherein the testing comprises pushing a probe through the cap layer for electrical coupling to the interconnect pad 1802e — Deposit an etch stop layer and a bond dielectric structure overlying the cap layer, wherein the etch stop layer has a greater hardness than the cap layer 1802f — Pattern the cap layer, the etch stop layer, and the bond dielectric structure to form an opening overlying and exposing the interconnect pad 1802g — Form a bond structure in the opening, wherein the bond structure comprises a bond pad and a bond contact extending from the bond pad to the interconnect pad 1804 — Form a second IC die repeating across a second wafer 1806 — Hybrid bond the first IC die to the second IC via at a bond interface to form a three-dimensional (3D) IC, wherein the hybrid bonding comprises metal-to-metal bonding and dielectric-to-dielectric bonding 1808 — Dicing the first and second wafers to separate instances of the 3D IC from each other

Fig. 18

CAP LAYER FOR PAD OXIDATION PREVENTION

REFERENCE TO RELATED APPLICATION

This Application claims the benefit of U.S. Provisional Application No. 63/480,354, filed on Jan. 18, 2023, the contents of which are incorporated by reference in their entirety.

BACKGROUND

Wafer acceptance testing (WAT) is a process by which integrated circuit (IC) dies of a wafer undergo testing during semiconductor manufacturing. WAT is generally performed after back-end-of-line (BEOL) processing and before the wafer is diced to separate the IC dies from each other. During WAT, circuit probes are placed on WAT pads of the IC dies. The circuit probes are then used apply electrical test patterns to the IC dies and to measure responses to the electrical test patterns to ensure proper operation.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 8A and 8B to FIG. 17 illustrate a series of views of some embodiments of a method for forming a 3D IC comprising a cap layer for pad oxidation prevention according to aspects of the present disclosure.

FIG. 18 illustrates a block diagram of some embodiments of the method of FIGS. 8A and 8B to FIG. 17.

DETAILED DESCRIPTION

Figures 1A, 1B:
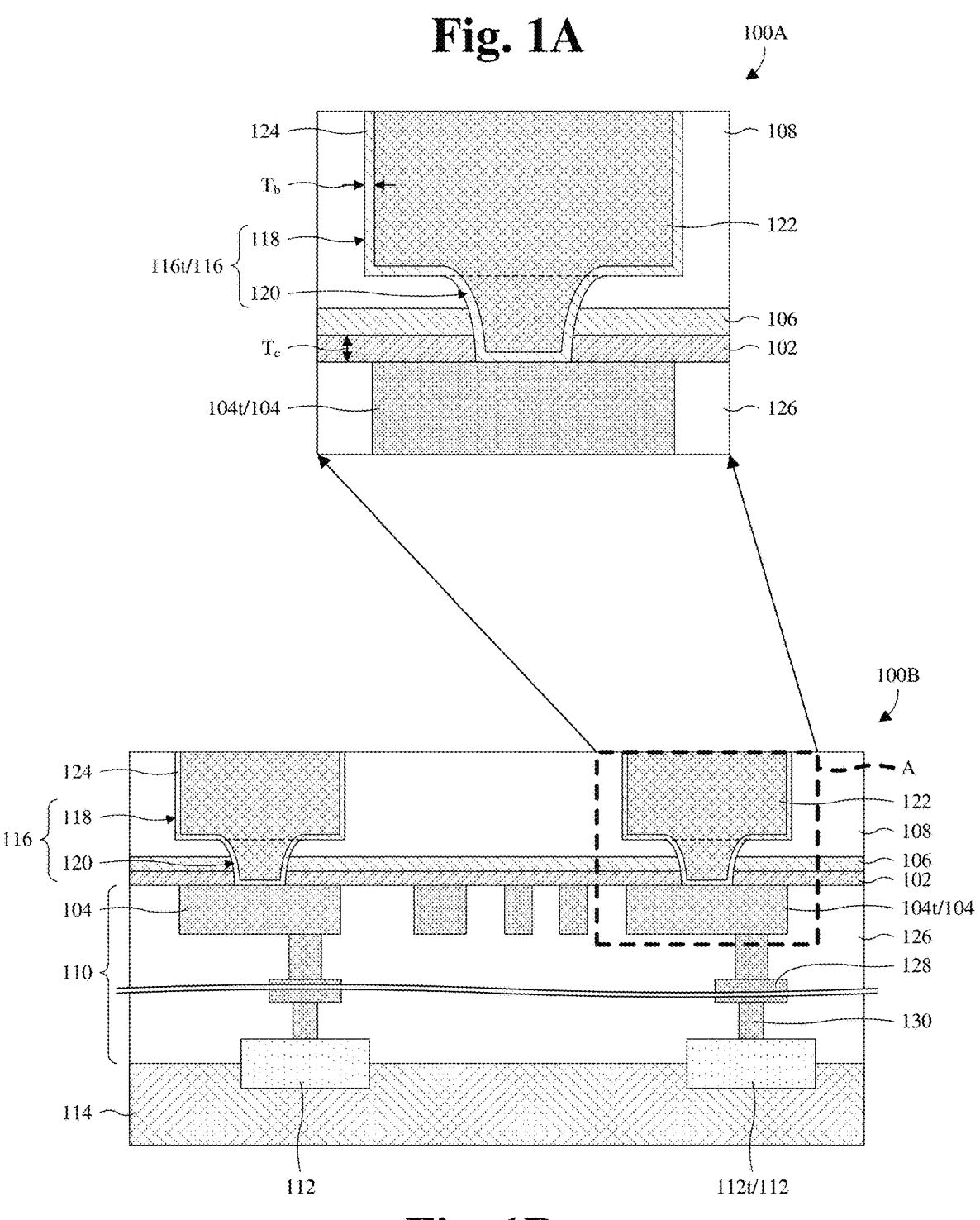
FIGS. 1A and 1B illustrate cross-sectional views of some embodiments of an integrated circuit (IC) die comprising a cap layer for pad oxidation prevention according to aspects of the present disclosure.

The present disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A three-dimensional (3) integrated circuit (IC) may comprise a first IC die and a second IC die hybrid bonded together. Hybrid bonding is bonding that comprises both metal-to-metal bonding and dielectric-to-dielectric bonding. Further, the 3D IC may be formed by wafer-on-wafer (WoW) manufacturing. WoW manufacturing bonds the first IC die and the second IC die together at the wafer level. As such, a first wafer across which the first IC die repeats is hybrid bonded to a second wafer across which the second IC die repeats.

During manufacture of the first IC die, an interconnect structure is formed with a layer of conductive features, including a wafer acceptance test (WAT) pad, exposed at a top of the interconnect structure. A silicon nitride cap layer is deposited atop the layer of conductive features to prevent oxidation. Further, the silicon nitride cap layer is patterned by a photolithography/etching process to form a pad opening exposing the WAT pad. A probe is applied to the WAT pad through the pad opening, and WAT is performed on the first IC die via the WAT pad. After WAT, a bond structure is formed on the interconnect structure and the first IC die is hybrid bonded to the second IC die through the bond structure.

The pad opening allows the probe to reach the WAT pad without having to push through the silicon nitride cap layer. Silicon nitride is hard, whereby attempting to push the probe through the silicon nitride cap layer to the WAT pad would likely damage the probe. However, the pad opening exposes the WAT pad and hence subjects the WAT pad to oxidation. Oxide atop the WAT pad increases the likelihood of poor electrical coupling between the WAT pad and the probe and hence increases the likelihood of failed WAT. Further, the photolithography/etching process to form the pad opening is costly and may result in damage to the WAT pad and/or a semiconductor device underlying the pad opening. Such damage may for example, result from ion bombardment during etching.

Because of the damage to the WAT pad, and because of the pad opening, there is high topographical variation at the WAT pad. As such, etching and depositing to form the bond structure are non-uniform. This non-uniformity results in the bond structure forming with a non-uniform bottom profile. Further, a diffusion barrier layer of the bond structure may form with a non-uniform thickness. The non-uniformness decreases electrical performance of the bond structure in terms of, for example, resistor capacitor (RC) delay, electromigration, and the like.

As such, manufacturing yields for the 3D IC may be reduced.

Various embodiments of the present disclosure are directed towards an IC die comprising an enhanced cap layer for pad oxidation prevention, as well as a method for forming the IC die. In some embodiments, an interconnect pad overlies a substrate at a top of an interconnect structure, and a bond structure overlies and extends from a surface of the interconnect pad. The bond structure may for example, comprise a bond pad and a bond contact extending from the surface of the interconnect pad to the bond pad. A cap layer and an etch stop layer overlie the surface around the bond structure. Further, the cap layer separates the etch stop layer from the interconnect pad and is soft. Soft may for example, refer to a hardness less than silicon nitride and/or less than a hardness of the etch stop layer.

During manufacture of the IC die, the surface of the interconnect pad becomes exposed, whereby the cap layer is deposited to prevent oxidation of the interconnect pad. A probe is pushed through the cap layer to the interconnect pad and testing (e.g., WAT or the like) is performed on the IC die through the interconnect pad. After the testing, the etch stop layer and the bond structure are formed. In some embodiments, the IC die is then bonded (e.g., hybrid bonded or the like) to another IC die through the bond structure.

Because the cap layer is soft, the probe may be pushed through the cap layer without damage. As such, no pad opening is formed in the cap layer to expose the interconnect pad for the testing. Because the interconnect pad is not exposed during the testing, the interconnect pad is not subject to oxidation and electrical coupling between the interconnect pad and the probe is good. Further, because no pad opening is formed, the cost of a photolithography/etching process is saved and no etch damage occurs to the interconnect pad and other structure (e.g., a semiconductor device or the like) underlying the interconnect pad.

Because no etch damage occurs to the interconnect pad, and because there is no pad opening at the interconnect pad, topographical variation at the interconnect pad is low while forming the bond structure. Because of the low topographical variation, etching and depositing to form the bond structure have high uniformity. For example, a barrier layer of the bond structure may have a highly uniform thickness. The high uniformity results in good electrical performance for the bond structure in terms of, for example, RC delay, electromigration, and the like. As such, manufacturing yields for the 3D IC may be high.

With reference to FIGS. 1A and 1B, various cross-sectional views 100A, 100B of some embodiments of an IC die comprising a cap layer 102 according to aspects of the present disclosure is provided. FIG. 1B corresponds to a cross-sectional view 100B, whereas FIG. 1A corresponds to an enlarged cross-sectional view 100A within box A of FIG. 1B. The IC die may also be referred to as a semiconductor structure, an IC chip, or the like.

Interconnect pads 104 underlie the cap layer 102 at a top of an interconnect structure 110 and form a layer of interconnect features. Further, the interconnect pads 104 are respectively and electrically coupled to semiconductor devices 112, which underlie the interconnect structure 110 on a substrate 114. The interconnect pads 104 comprise a test interconnect pad 104t, and the semiconductor devices 112 comprise a test semiconductor device 112t electrically coupled to the test interconnect pad 104t.

An etch stop layer 106 and a bond dielectric structure 108 overlie the cap layer 102. The bond dielectric structure 108 overlies the etch stop layer 106, and the etch stop layer 106, the cap layer 102, and the bond dielectric structure 108 accommodate bond structures 116 individual to and respectively on the interconnect pads 104. The bond structures 116 comprise a test bond structure 116t atop the test interconnect pad 104t.

The cap layer 102 has a lower reactivity (e.g., depends on more energy to react) with oxygen than the interconnect pads 104 and is configured to block oxygen from reaching the interconnect pads 104 during manufacture of the IC die. Further, the cap layer 102 has a small hardness (e.g., is soft). The small hardness may for example, be a hardness less than a hardness of silicon nitride (e.g., SiN) or the like and/or a hardness less than a hardness of the etch stop layer 106. Further, the small hardness may for example, be a hardness less than about 9.0, about 8.5, or some other suitable value on the Mohs scale.

During manufacture of the IC die, the test semiconductor device 112t may undergo testing. The testing may for example, be performed after the cap layer 102 is formed so as not to subject interconnect features at a top of the interconnect structure 110 to oxidation. The testing may arrange a probe on the test interconnect pad 104t. Further, the testing may apply electrical test patterns to the test semiconductor device 112t via the test interconnect pad 104t and may monitor responses to the electrical test patterns via the test interconnect pad 104t. The testing may for example, be or comprise WAT and/or the like.

Because the cap layer 102 is soft, the probe may be pushed through the cap layer 102 to the test interconnect pad 104t without damage to the probe. As such, no pad opening is formed in the cap layer 102 to expose the test interconnect pad 104t before testing. Because no pad opening is formed, the test interconnect pad 104t is not exposed during testing. Hence, the test interconnect pad 104t is not subject to oxidation, which may enhance electrical coupling between the test interconnect pad 104t and the probe. Further, because no pad opening is formed, the cost of a photolithography/etching process to form the pad opening is saved and no etch damage (e.g., plasma damage) occurs to the test interconnect pad 104t and structure (e.g., the test semiconductor device 112t) underlying the test interconnect pad 104t.

Because no etch damage occurs to the test interconnect pad 104t, and because there is no pad opening at the test interconnect pad 104t, the bond dielectric structure 108 forms with low topographical variation at the test interconnect pad 104t. As a result, patterning and deposition processes to form the test bond structure 116t are more uniform. The uniformness results in good electrical performance in terms of, for example, RC delay, electromigration, and the like. As such, manufacturing yields for the 3 D IC may be high.

In some embodiments, to the extent that the testing is WAT, the test semiconductor device 112t may also be known as the WAT semiconductor device 112t. Further, the test interconnect pad 104t and the test bond structure 116t may also be known respectively as the WAT pad 104t and the WAT bond structure 116t.

In some embodiments, the cap layer 102 is or comprises silicon carbon nitride (e.g., SiCN) or the like, and/or the etch stop layer 106 is or comprises silicon nitride (e.g., SiN) or the like. The addition of carbon into silicon nitride reduces hardness, whereby silicon carbon nitride has a lesser hardness (e.g., is softer) than silicon nitride without any carbon. In some embodiments, the cap layer 102 is or comprises SiCN, where x corresponds to a percentage of atoms of carbon and nitrogen and is less than 1 (e.g., 100%). Hence, as a number of atoms of carbon increases in the cap layer 102, a number of atoms of nitrogen in the cap layer 102 decreases. In some embodiments, x is greater than about 60%, 70%, 80%, or some other suitable value. In some embodiments in which the cap layer 102 is or comprises silicon carbon nitride, an atomic percentage of nitrogen in the cap layer 102 is less than about 40, about 30, or some other suitable value and/or is about 1-20, about 20-40, or some other suitable value.

In some embodiments, the cap layer 102 is or comprises silicon carbide (e.g., SiC) or the like, and/or the etch stop layer 106 is or comprises silicon nitride (e.g., SiN) or the like. In some embodiments in which the cap layer 102 is or comprises silicon carbide, an atomic percentage of carbon in the cap layer 102 is about 40-60 percent, about 40-50 percent, about 50-60 percent, or some other suitable percentage.

In some embodiments, the cap layer 102 is a dielectric layer comprising carbon. For example, the cap layer 102 may be or comprise a silicon carbon nitride layer. Silicon carbon nitride of the silicon carbon nitride layer may for example, be as above. As another example, the cap layer 102 may be or comprise a silicon carbide layer. Silicon carbide of the silicon carbide layer may for example, be as above. As another example, the cap layer 102 may comprise both the silicon carbon nitride layer and the silicon carbide layer.

In some embodiments, the cap layer 102 is amorphous. For example, the cap layer 102 may be or comprise amorphous silicon carbon nitride, amorphous silicon carbide, or the like. Amorphousness reduces a hardness of the cap layer 102 and hence lets a testing probe better penetrate through the cap layer 102 without damage during testing. In some embodiments (e.g., when the cap layer 102 is amorphous silicon carbon nitride, amorphous silicon carbide, or the like), the cap layer 102 is stable (e.g., maintains amorphousness) at high temperatures, such as, for example, temperatures of 1100 degrees Celsius or more.

In some embodiments, a thickness T of the cap layer 102 is about 75-200 angstroms, about 75-137.5 angstroms, about 137.5-200 angstroms, or some other suitable value. If the thickness $T_c$ of the cap layer 102 is too small (e.g., less than about 75 angstroms), uniformity of the thickness $T_c$ may be poor. Further, the cap layer 102 may not prevent oxygen from reaching the interconnect pads 104 and oxidizing the interconnect pads 104. If the thickness is too large (e.g., more than about 200 angstroms), the probes for testing may be unable to push through the cap layer 102 without damage. Further, the cap layer 102 may apply a high amount of stress on underlying, thereby increasing the risk of delamination, cracking, and bending.

With continued reference to FIGS. 1A and 1B, the bond structures 116 comprise individual bond pads 118 and individual bond contacts 120. The bond pads 118 are at a top of the bond dielectric structure 108 and are recessed into the bond dielectric structure 108. Further, the bond pads 118 have top surfaces flush with a top surface of the bond dielectric structure 108. The bond contacts 120 extend respectively from the bond pads 118 respectively to the interconnect pads 104. Further, the bond contacts 120 extend through the etch stop layer 106 and the cap layer 102 respectively to the interconnect pads 104.

The bond structures 116 may for example, correspond to hybrid bond structures to facilitate hybrid bonding of the IC die to another IC die to form a 3D IC. Hybrid bonding is bonding that comprises both metal-to-metal bonding and dielectric-to-dielectric bonding. The metal-to-metal bond would correspond to the bond pads 118, whereas the dielectric-to-dielectric bond would correspond to the bond dielectric structure 108.

The bond structures 116 further comprise individual bond plugs 122 and individual bond barrier layers 124. The bond plugs 122 are paired respectively with the bond barrier layers 124, and each pair forms a corresponding bond pad and a corresponding bond contact. In alternative embodiments, the bond pads 118 are formed from separate bond plugs and bond barrier layers as the bond contacts 120. Further, in alternative embodiments, the bond barrier layers 124 are omitted. The bond barrier layers 124 are on (e.g., line) sidewalls and bottom surfaces of corresponding ones of the bond plugs 122 and are configured to prevent outward diffusion of conductive material from the bond plugs 122.

Because patterning and deposition processes to form the test bond structure 116*t* are more uniform as described above, the test bond structure 116*t* has a well-controlled bottom profile similar to other bond structures. Further, the bond barrier layer 124 of the test bond structure 116*t* has a thickness $T_b$ with high uniformity. Collectively, this leads to improved performance of the test bond structure 116*t* in terms of, for example, RC delay, electromigration, and the like and may for example, enhance manufacturing yields.

In some embodiments, the bond plugs 122 are or comprise copper and/or some other suitable conductive material(s). In some embodiments, the bond barrier layers 124 are or comprise tantalum, tantalum nitride, some other suitable conductive material(s), or any combination of the foregoing. In some embodiments, the bond pads 118 and the bond contacts 120 are or comprise copper, tantalum, tantalum nitride, some other suitable conductive material(s), or any combination of the foregoing.

In some embodiments, the etch stop layer 106 is or comprises silicon nitride and/or some other suitable dielectric material(s). In alternative embodiments, the etch stop layer 106 is omitted. In some embodiments, the bond dielectric structure 108 is or comprises silicon oxide, silicon oxynitride, silicon nitride, some other suitable dielectric material(s), or any combination of the foregoing. In some embodiments, the bond dielectric structure 108 is or comprises multiple dielectric layers stacked over the etch stop layer 106.

The interconnect structure 110 comprises a plurality of interconnect features stacked in an interconnect dielectric structure 126 to form conductive paths from the semiconductor devices 112. The plurality of interconnect features include the interconnect pads 104, interconnect wires 128, and interconnect vias 130. The interconnect vias 130 are grouped into via layers, whereas the interconnect pads 104 and interconnect wires 128 are grouped into wire/pad layers alternatingly stacked with the via layers. Further, vias in a via layer closest to the substrate 114 may also be referred to as interconnect contacts.

In some embodiments, the interconnect features are or comprise copper, tantalum, tantalum nitride, tungsten, some other suitable conductive material(s), or any combination of the foregoing. In some embodiments, the interconnect dielectric structure 126 is or comprises silicon oxide, silicon oxynitride, silicon carbide, silicon nitride, some other suitable dielectric material(s), or any combination of the foregoing. In some embodiments, the interconnect dielectric structure 126 is or comprises multiple dielectric layers.

The semiconductor devices 112 underlie and are electrically coupled to the interconnect structure 110, which electrically couples the semiconductor devices 112 to the interconnect pads 104. Further, the semiconductor devices 112 overlie the substrate 114 and, in some embodiments, are partially formed by the substrate 114. The semiconductor devices 112 may for example, be or comprise deep trench capacitors (DTCs), metal-oxide-semiconductor field-effect transistors (MOSFETs), or the like.

In some embodiments, the substrate 114 is a bulk semiconductor substrate. For example, the substrate 114 may be a bulk substrate of monocrystalline silicon or the like. In other embodiments, the substrate 114 is a semiconductor-on-insulator (SOI) substrate or some other suitable type of semiconductor substrate.

Figure 2A:
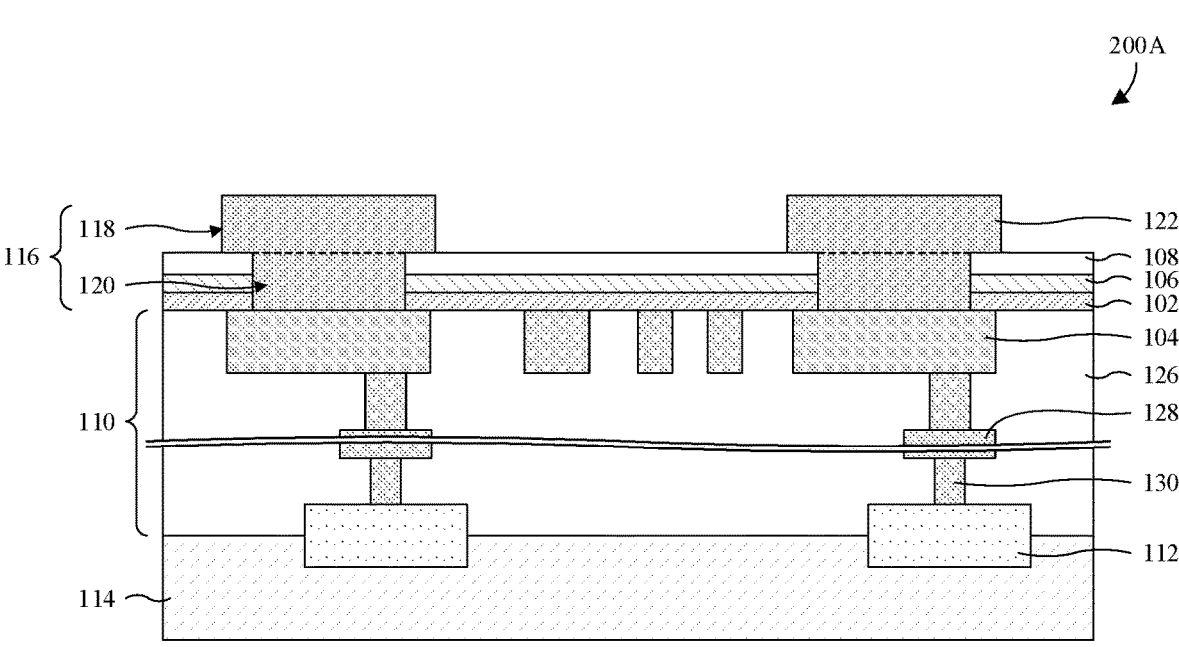
FIGS. 2A-2C illustrate cross-sectional views of some alternative embodiments of the IC die of FIGS. 1A and 1B.
Figure 2B:
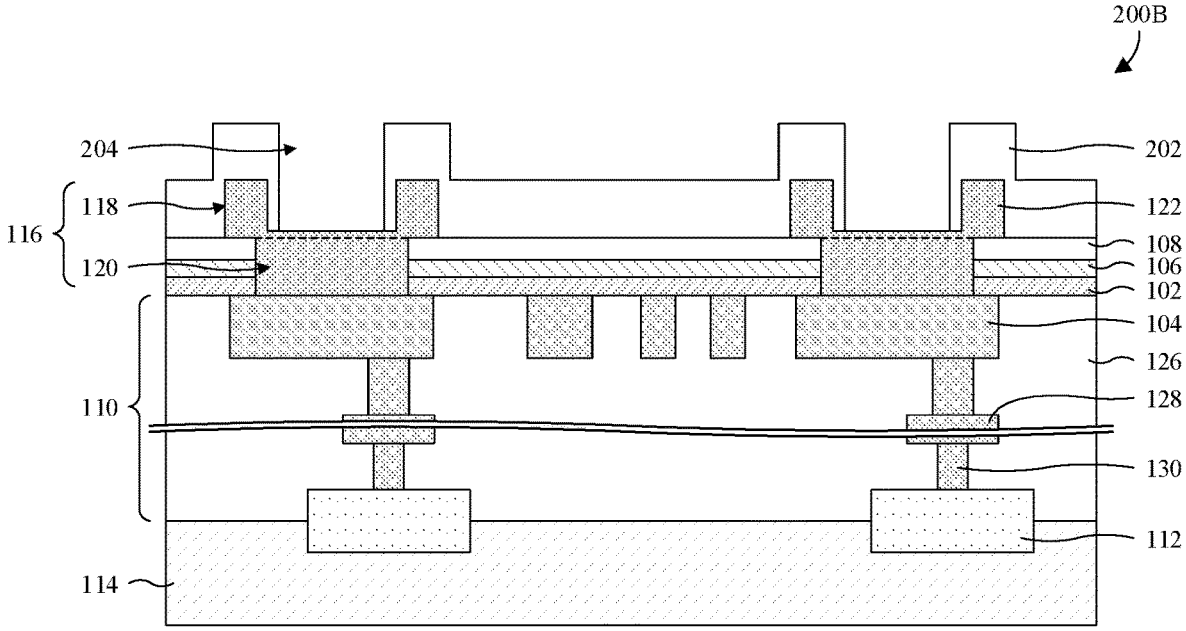
Figure 2C:
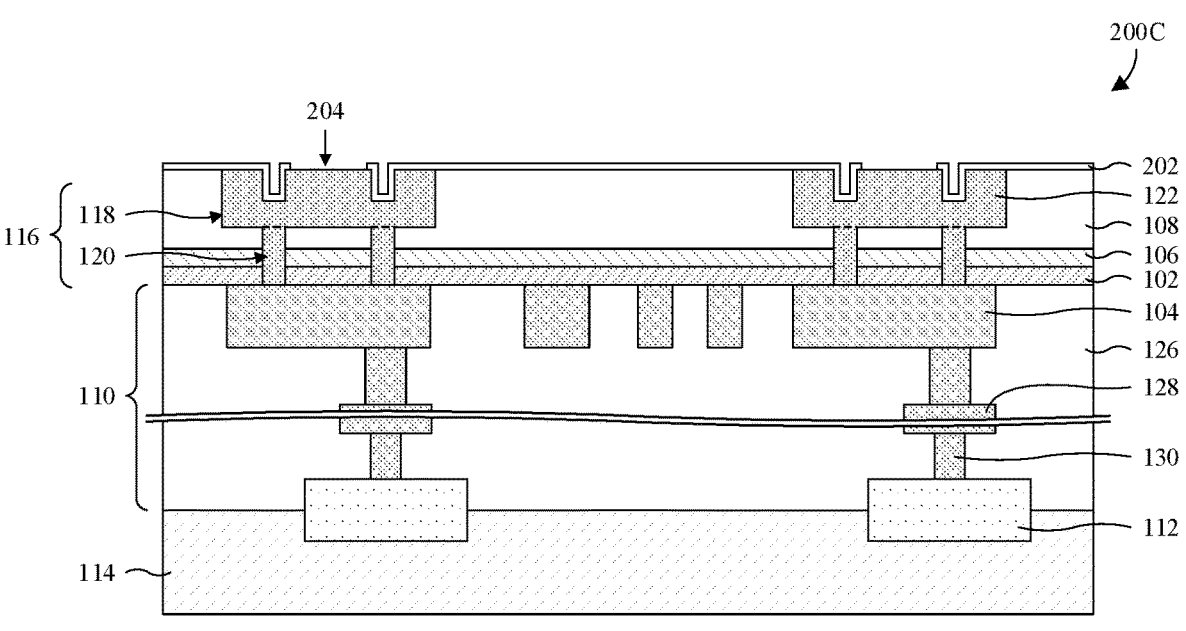

With reference to FIGS. 2A-2C, cross-sectional views 200A-200C of some alternative embodiments of the IC die of FIGS. 1A and 1B are provided in which the bond structures 116 are varied. While certain alternatives to the bond structures 116 are illustrated, other suitable alternatives are amenable in alternative embodiments.

In FIG. 2A, the bond barrier layers 124 are omitted, whereby the bond structures 116 are the same as the bond plugs 122. Further, the bond structures 116 overlie a top surface of the bond dielectric structure 108 and have flat top surfaces. In some embodiments, the bond structures 116 are or comprise aluminum and/or some other suitable conductive material(s).

In FIG. 2B, the bond barrier layers 124 are omitted and the bond structures 116 overlie a top surface of the bond dielectric structure 108 as in FIG. 2A. In contrast with FIG. 2A, top surfaces of the bond structures 116 are depressed. Further, a passivation layer 202 overlies the bond structures 116 and forms pad openings 204 exposing the bond structures 116.

In FIG. 2C, the bond barrier layers 124 are omitted and the bond structures 116 each comprise multiple (e.g., two) bond contacts 120. Further, top surfaces of the bond structures 116 are depressed directly over the bond contacts 120, and a passivation layer 202 overlies the bond structures 116 and forms pad openings 204 exposing the bond structures 116.

Figure 3:
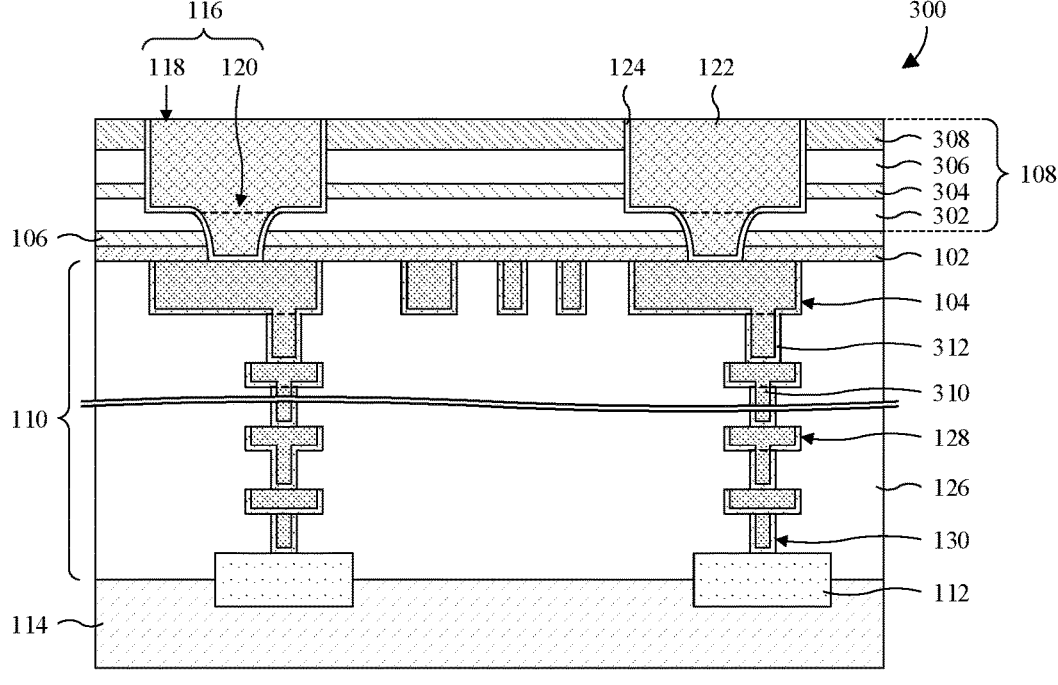
FIG. 3 illustrates a cross-sectional view of some more detailed embodiments of the IC die of FIGS. 1A and 1B.

With reference to FIG. 3, a cross-sectional view 300 of some more detailed embodiments of the IC die of FIGS. 1A and 1B is provided in which the interconnect features (e.g., the interconnect pads 104) of the interconnect structure 110 and the bond dielectric structure 108 are shown in more detail.

The bond dielectric structure 108 comprises a first passivation layer 302, a second etch stop layer 304, a second passivation layer 306, and a bond dielectric layer 308. The first passivation layer 302 overlies the etch stop layer 106, the second etch stop layer 304 overlies the first passivation layer 302, the second passivation layer 306 overlies the second etch stop layer 304, and the bond dielectric layer 308 overlies the second passivation layer 306.

The second etch stop layer 304 is configured as an etch stop for use while etching to form an opening for the bond pads 118. In contrast, the etch stop layer 106 is configured as an etch stop for use while etching to form the bond contacts 120. The second etch stop layer 304 may for example, be or comprise a same dielectric material as the etch stop layer 106 and/or may for example, be or comprise silicon nitride and/or some other suitable dielectric(s). Further, the second etch stop layer 304 may for example, have a greater hardness than the cap layer 102 and/or may for example, have a same hardness as the etch stop layer 106. The etch stop layer 106 may also be referred to as a first etch stop layer 106.

The bond dielectric layer 308 is at a top of the bond structures 116. Further, a top surface of the bond dielectric layer 308 is flush with top surfaces of the bond pads 118 and hence is flush with top surfaces of the bond structures 116. The bond dielectric layer 308 may for example, be or comprise silicon oxynitride and/or some other suitable dielectric(s).

The first passivation layer 302 and the second passivation layer 306 separate the second etch stop layer 304 respectively from the etch stop layer 106 and the bond dielectric layer 308. Further, the first passivation layer 302 and the second passivation layer 306 are different dielectric materials than the etch stop layer 106, the second etch stop layer 304, and the bond dielectric layer 308. The first passivation layer 302 and the second passivation layer 306 may for example, be or comprise silicon oxide and/or some other suitable dielectrics.

The interconnect structure 110 comprises a plurality of interconnect features, including the interconnect pads 104, the interconnect wires 128, and the interconnect vias 130. Similar to the bond pads 118 and the bond contacts 120, the interconnect features are formed by interconnect plugs 310 and interconnect barrier layers 312. The interconnect plugs 310 are paired respectively with the interconnect barrier layers 312, and each pair forms at least one corresponding interconnect feature. In alternative embodiments, the interconnect barrier layers 312 are omitted. The interconnect barrier layers 312 are on (e.g., line) sidewalls and bottom surfaces of corresponding ones of the interconnect plugs 310 and are configured to prevent outward diffusion of conductive material from the interconnect plugs 310.

In some embodiments, the interconnect plugs 310 are or comprise copper and/or some other suitable conductive material(s). In some embodiments, the interconnect barrier layers 312 are or comprise tantalum, tantalum nitride, some other suitable conductive diffusion barrier material(s), or any combination of the foregoing. In some embodiments, the interconnect features are or comprise copper, tantalum, tantalum nitride, some other suitable conductive material(s), or any combination of the foregoing.

Figure 4:
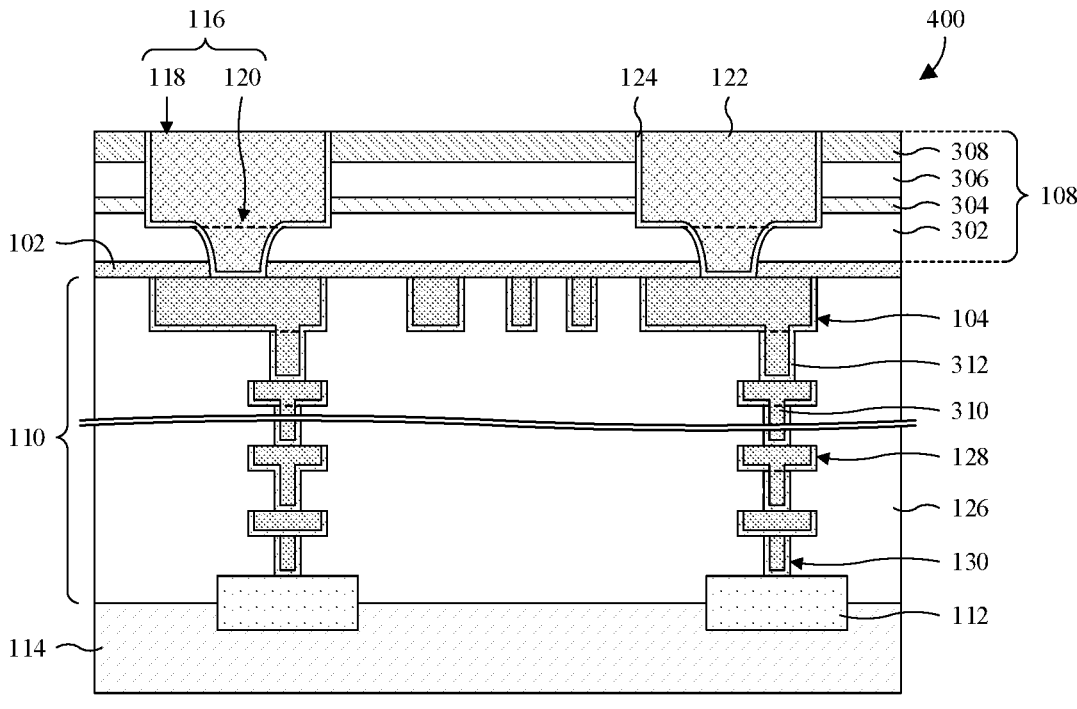
FIG. 4 illustrates a cross-sectional view of some alternative embodiments of the IC die of FIG. 3.

With reference to FIG. 4, a cross-sectional view 400 of some alternative embodiments of the IC die of FIG. 3 is provided in which the etch stop layer 106 is omitted. In such embodiments, the cap layer 102 is configured as an etch stop for use while etching to form the bond contacts 120.

Figure 5:
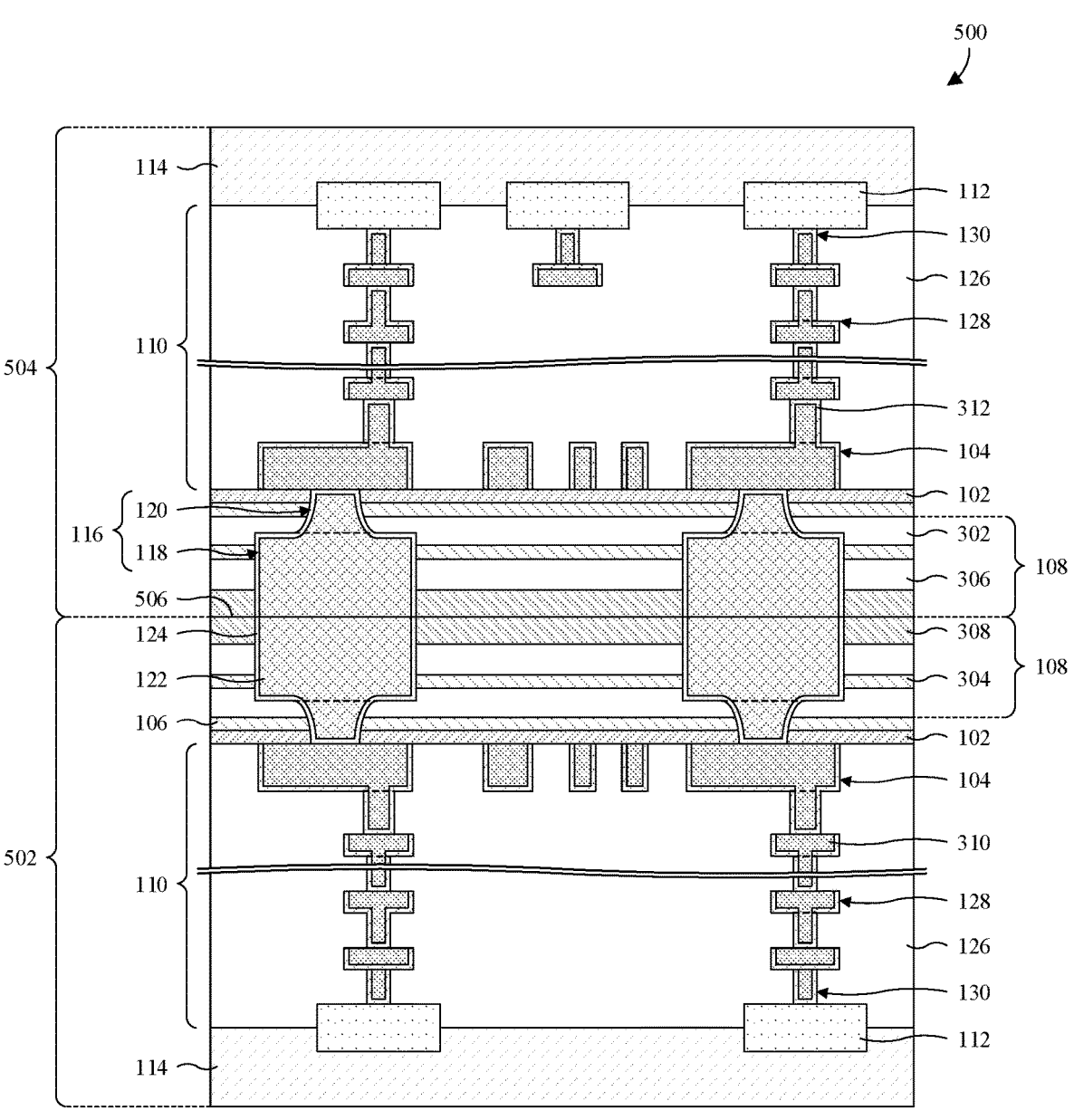
FIG. 5 illustrates a cross-sectional view of some embodiments of a three-dimensional (3D) IC comprising a cap layer for pad oxidation prevention according to aspects of the present disclosure.

With reference to FIG. 5, a cross-sectional view 500 of some embodiments of a 3D IC comprising a cap layer 102 for pad oxidation prevention according to aspects of the present disclosure is provided. The 3D IC may also be more generally referred to as a semiconductor structure, a 3D IC die, a 3D IC chip, or the like.

A first IC die 502 and a second IC die 504 are bonded to each other at a bond interface 506. The first IC die 502 and the second IC die 504 are each individually as the IC die of FIG. 3 is illustrated and described. However, the second IC die 504 has a different number of semiconductor devices 112. Further, the interconnect structure 110 of the second IC die 504 has a different layout of interconnect features.

The bond interface 506 between the first IC die 502 and the second IC die 504 is a hybrid bond interface. Hybrid bonding is bonding that comprises both metal-to-metal bonding and dielectric-to-dielectric bonding. The bond pads 118 of the first and second IC dies 502, 504 directly contact at the bond interface 506, and the bond dielectric structures 108 of the first and second IC dies 502, 504 directly contact at the bond interface 506. Further, the bond structures 116 of the first IC die 502 correspond to and mirror the bond structures 116 of the second IC die 504, whereby the hybrid bond may be regarded as symmetrical.

Figure 6:
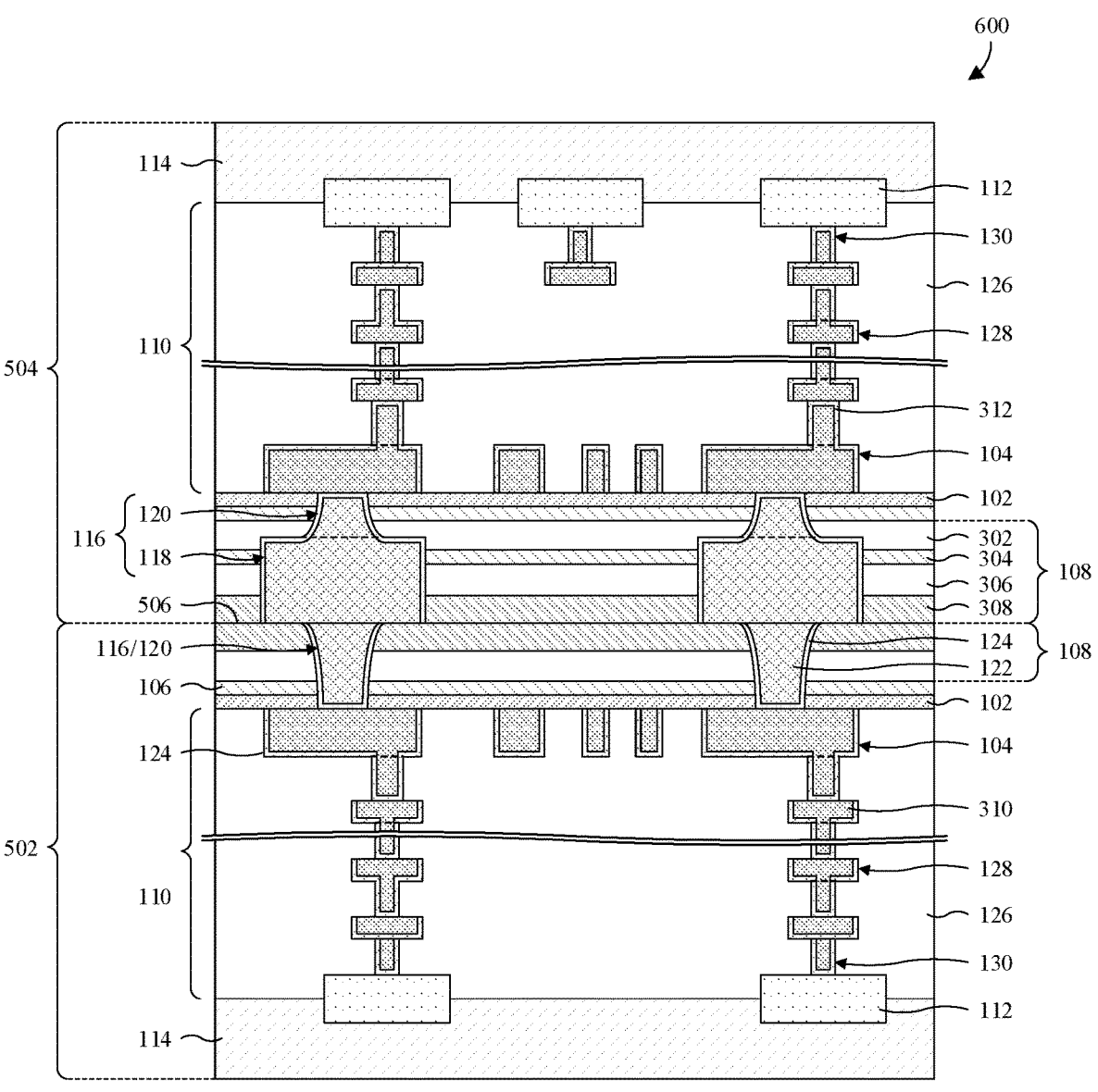
FIG. 6 illustrates a cross-sectional view of some alternative embodiments of the 3D IC of FIG. 5.

With reference to FIG. 6, a cross-sectional view 600 of some alternative embodiments of the 3D IC of FIG. 5 is provided in which the bond structures 116 of the first IC die 502 omit the bond pads 118. Further, the bond dielectric structure 108 of the first IC die 502 omits the second etch stop layer 304 and the second passivation layer 306. As a result, the bond structures 116 of the first IC die 502 do not mirror the bond structures 116 of the second IC die 504 and the hybrid bond may be regarded as asymmetrical.

Figure 7:
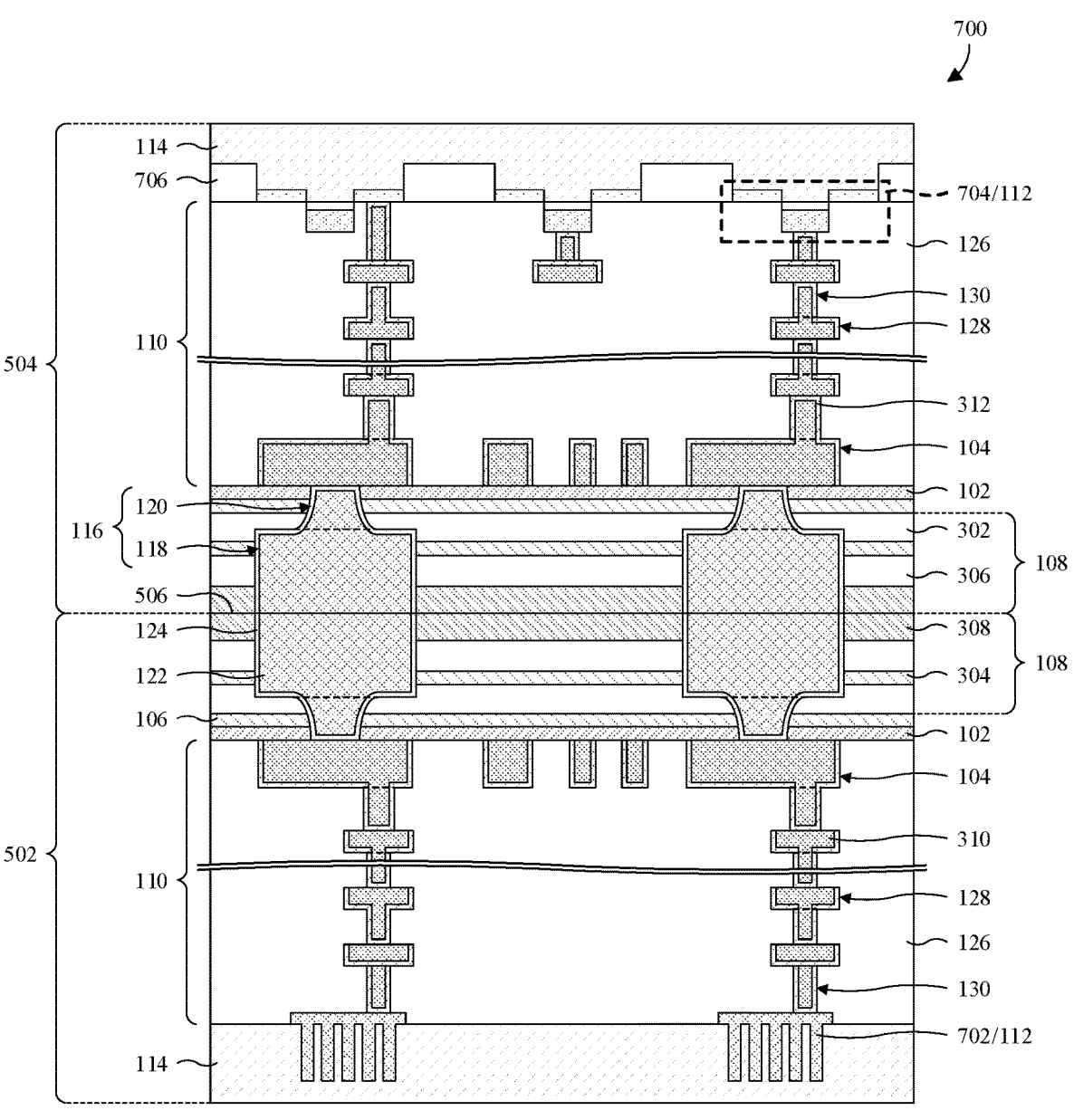
FIG. 7 illustrates a cross-sectional view of some more detailed embodiments of the 3D IC of FIG. 5.

With reference to FIG. 7, a cross-sectional view 700 of some more detailed embodiments of the 3D IC of FIG. 5 is provided. The semiconductor devices 112 of the first IC die 502 are DTCs 702 and protrude into the substrate 114 of the first IC die 502. The semiconductor devices 112 of the second IC die 504 are transistors 704 and are separated from each other by a trench isolation structure 706 extending into the substrate 114 of the second IC die 504. The transistors 704 may for example, be MOSFETs, nanosheet field-effect transistors (nanosheet FETs), nanowire field-effect transistors (nanowire FETs), fin field-effect transistors (finFETs), or the like. In alternative embodiments, the semiconductor devices 112 of the first IC die 502 are some other suitable type of semiconductor device and/or the semiconductor devices 112 of the second IC die 504 are some other suitable type of semiconductor device.

With reference to FIGS. 8A and 8B to FIG. 17, a series of views of some embodiments of a method for forming a 3D IC comprising a cap layer for pad oxidation prevention according to aspects of the present disclosure is provided. The 3D IC may for example, correspond to the 3D IC of FIG. 7 or some other suitable 3D IC.

Figure 8A:
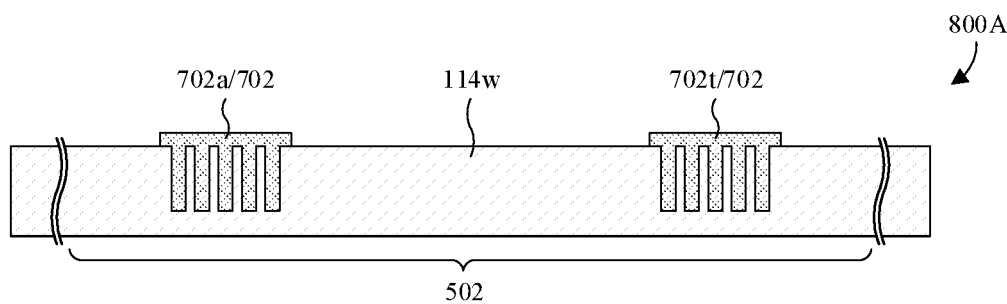
Figure 8B:
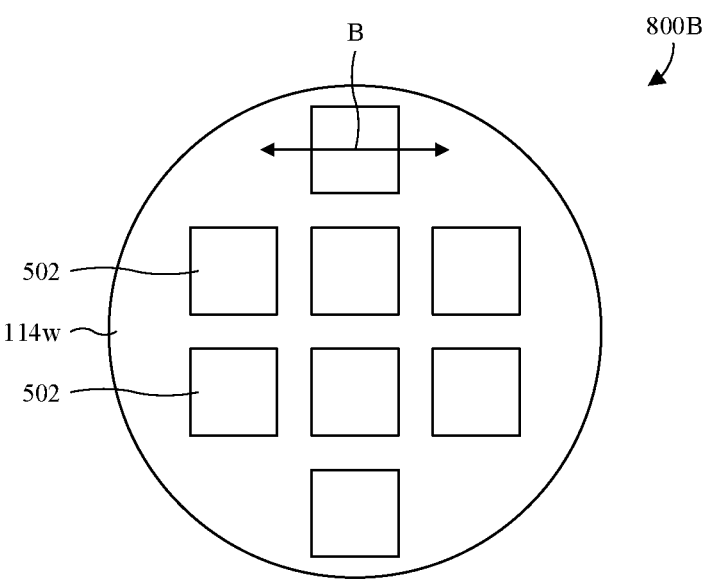

As illustrated by FIGS. 8A and 8B to FIG. 14, a first IC die 502 is formed repeating in a grid-shaped pattern across a wafer 114$w$. The wafer 114$w$ may for example, be a semiconductor wafer or the like and may for example, also be known as a first wafer, a first substrate, or the like. FIG. 8B corresponds to a top layout view 800B, whereas FIGS. 8A and 9-14 correspond to cross-sectional views 800A, 900-1400 along line B in FIG. 8B.

Focusing on FIG. 8A, DTCs 702 are formed in the wafer 114$w$. In alternative embodiments, other suitable types of semiconductor devices may additionally or alternatively be formed. The DTCs 702 comprise a test DTC 702$t$ and an active DTC 702$a$.

Figure 9:
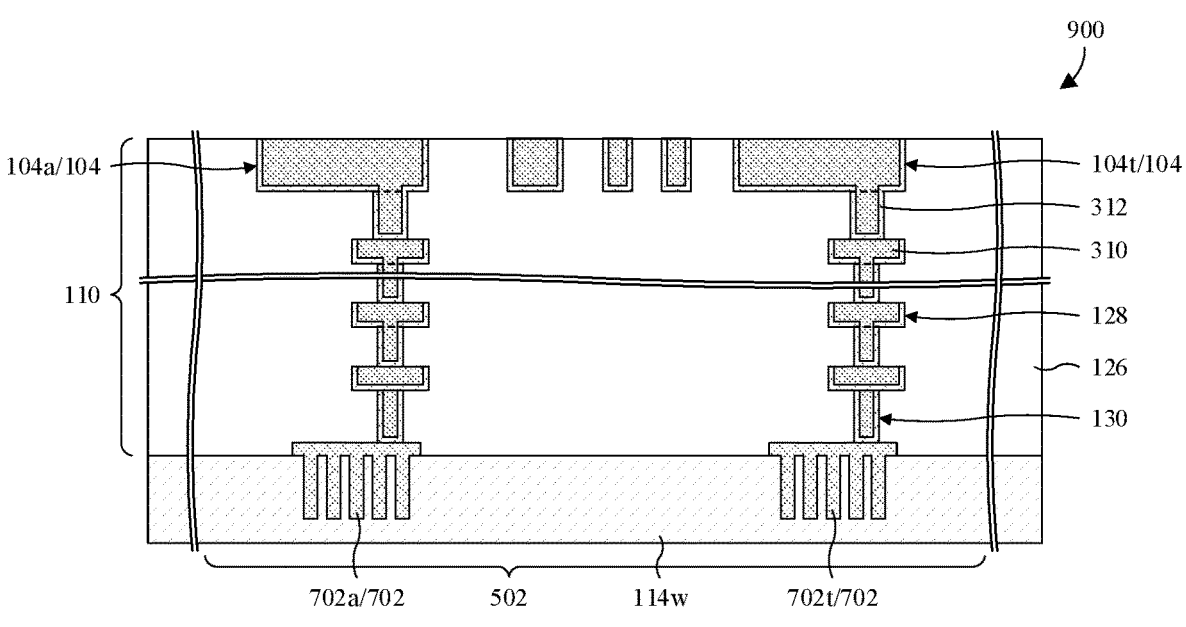

Focusing on FIG. 9, an interconnect structure 110 is formed overlying and electrically coupled to the DTCs 702. The interconnect structure 110 comprises a plurality of interconnect features stacked in an interconnect dielectric structure 126 to form conductive paths from the DTCs 702. The plurality of interconnect features include interconnect pads 104, interconnect wires 128, and interconnect vias 130.

The interconnect features are formed by interconnect plugs 310 and interconnect barrier layers 312. The interconnect plugs 310 are paired respectively with the interconnect barrier layers 312, and each pair forms at least one corresponding interconnect feature. In alternative embodiments, the interconnect barrier layers 312 are omitted. The interconnect barrier layers 312 cup undersides of the interconnect plugs 310, respectively, and are configured to prevent outward diffusion of conductive material from the interconnect plugs 310.

The interconnect vias 130 are grouped into via layers, and the interconnect pads 104 and the interconnect wires 128 are grouped into wire/pad layers alternatingly stacked with the via layers. The interconnect pads 104 are individual to and respectively overlie the DTCs 702 at a top of the interconnect structure 110. Further, the interconnect pads 104 are electrically coupled to the DTCs 702 by underlying portions of the interconnect structure 110. The interconnect pads 104 comprise a test interconnect pad 104$t$ and an active interconnect pad 104$a$ respectively and electrically coupled to the test DTC 702$t$ and the active DTC 702$a$.

Formation of the interconnect structure 110 concludes with formation of the interconnect pads 104. Formation of the interconnect pads 104 comprises: 1) patterning the interconnect dielectric structure 126 to form openings corresponding to the interconnect pads 104; 2) depositing a conductive layer in the openings; and 3) performing a planarization into the conductive layer to remove excess material outside the openings. The patterning may for example, be performed by a photolithography/etching process or the like. The planarization may for example, be performed by a chemical mechanical polish (CMP) or the like.

Figure 10:
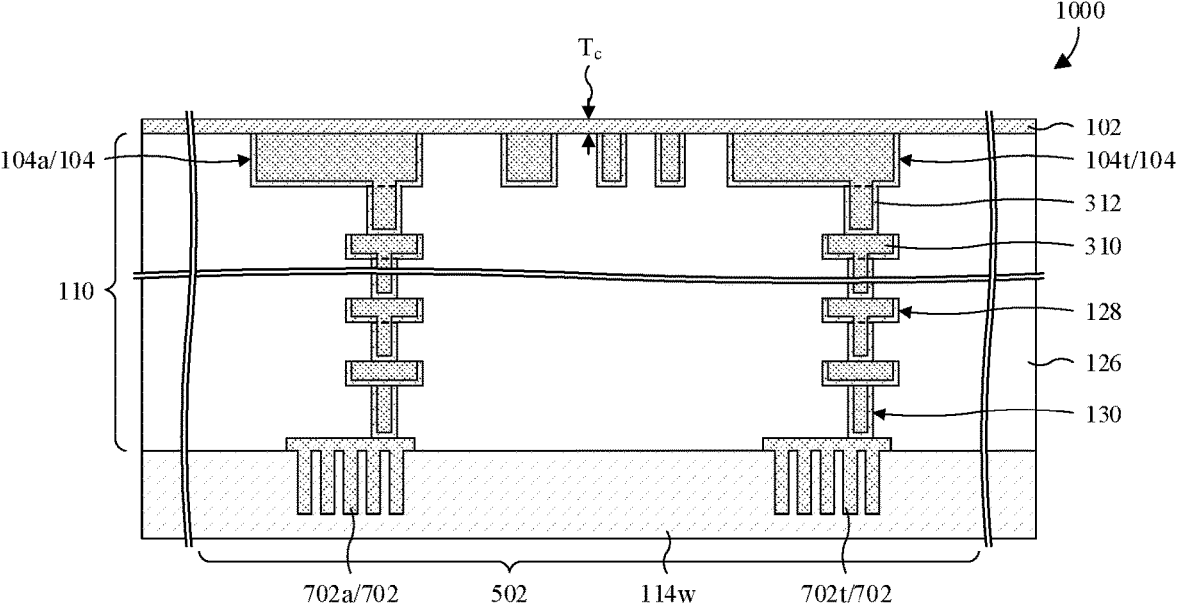

Focusing on FIG. 10, a cap layer 102 is deposited over the interconnect dielectric structure 126 and the interconnect pads 104. The cap layer 102 may for example, be deposited by chemical vapor deposition (CVD), physical vapor deposition (PVD), sputtering, atomic layer deposition (ALD), some other suitable deposition process, or the like.

The cap layer 102 has a lower reactivity (e.g., depends on more energy to react) with oxygen than the interconnect pads 104 and is configured to block oxygen from reaching the interconnect pads 104. Further, the cap layer 102 has a small hardness (e.g., is soft). The small hardness may for example, be a hardness less than a hardness of silicon nitride or the like. Further, the small hardness may for example, be a hardness less than about 9.0, about 8.5, or some other suitable value on the Mohs scale.

In some embodiments, the cap layer 102 is or comprises silicon carbon nitride (e.g., SiCN) or the like. In some embodiments, the cap layer 102 is or comprises $SiC_xN_{1-x}$, where x corresponds to a percentage of atoms of carbon and nitrogen and is less than 1. Hence, as a number of atoms of carbon increases in the cap layer 102, a number of atoms of nitrogen in the cap layer 102 decreases. In some embodiments, x is greater than about 60%, about 70%, about 80%, or some other suitable value. In some embodiments in which the cap layer 102 is or comprises silicon carbon nitride, an atomic percentage of nitrogen in the cap layer 102 is less than about 40, about 30, or some other suitable value and/or is about 1-20, about 20-40, or some other suitable value.

In alternative embodiments, the cap layer 102 is or comprises silicon carbide (e.g., SiC) or the like, and/or the etch stop layer 106 is or comprises silicon nitride (e.g., SiN) or the like. In some of such embodiments in which the cap layer 102 is or comprises silicon carbide, an atomic percentage of carbon in the cap layer 102 is about 40-60 percent, about 40-50 percent, about 50-60 percent, or some other suitable percentage.

In some embodiments, the cap layer 102 is amorphous. For example, the cap layer 102 may be or comprise amorphous silicon carbon nitride, amorphous silicon carbide, or the like. Amorphousness reduces a hardness of the cap layer 102. In some embodiments (e.g., when the cap layer 102 is amorphous silicon carbon nitride, amorphous silicon carbide, or the like), the cap layer 102 is stable (e.g., maintains amorphousness) at high temperatures, such as, for example, temperatures of 1100 degrees Celsius or more.

In some embodiments, a thickness $T_c$ of the cap layer 102 is about 75-200 angstroms, about 75-137.5 angstroms, about 137.5-200 angstroms. If the thickness $T_c$ of the cap layer 102 is too small (e.g., less than about 75 angstroms), uniformity of the thickness $T_c$ may be poor. Further, the cap layer 102 may not prevent oxygen from reaching the interconnect pads 104 and oxidizing the interconnect pads 104. If the thickness is too large (e.g., more than about 200 angstroms), testing probes hereafter used may be unable to push through the cap layer 102 without damage. Further, the cap layer 102 may apply a high amount of stress to underlying, thereby increasing the risk of delamination, cracking, and bending.

Figure 11:
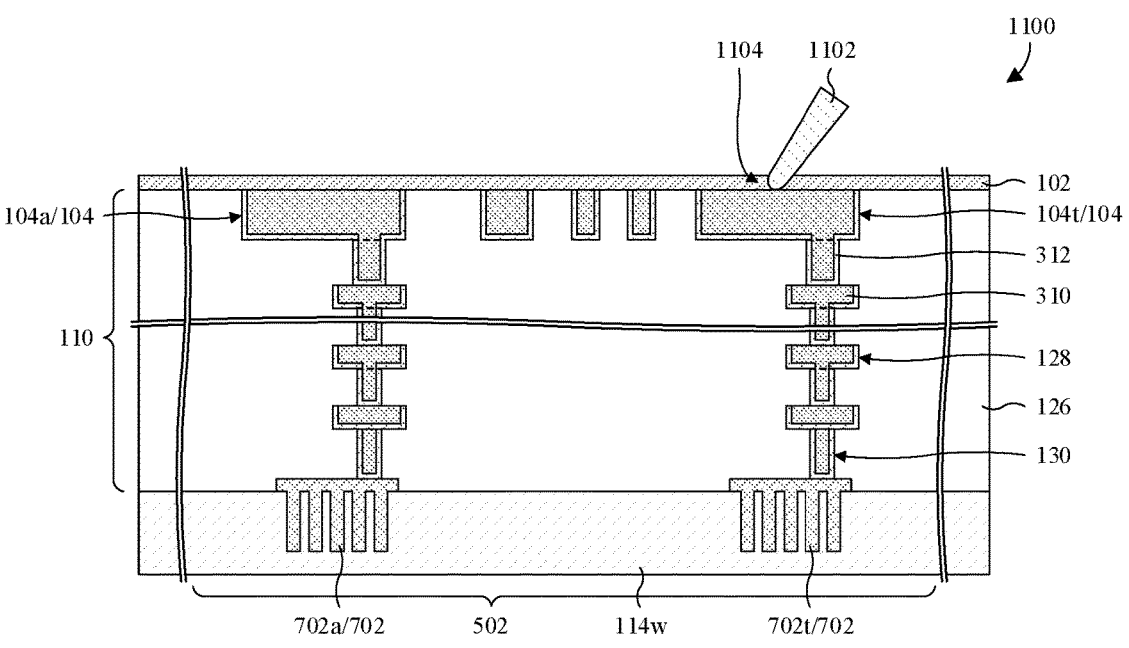

Focusing on FIG. 11, a probe 1102 is pushed through the cap layer 102 to the test interconnect pad 104*t*, thereby forming a probe opening 1104 through the cap layer 102 and electrically coupling to the test interconnect pad 104*t*. Further, testing is performed on the test DTC 702*t* through the test interconnect pad 104*t*. While only one probe is illustrated, more or less probes are amenable. In contrast with the test DTC 702*t*, the active DTC 702*a* does not undergo testing. Testing of the test DTC 702*t* is deemed representative of the active DTC 702*a*.

The testing may for example, be performed after the cap layer 102 is formed so as not to subject interconnect features at a top of the interconnect structure 110 to oxidation. Further, the testing may for example, be performed concurrently or sequentially on individual instances of the first IC die 502 seen in FIG. 8B. The testing comprises applying electrical test patterns to the test DTC 702*t* and observing the electrical responses. Depending on whether the electrical responses match expected electrical responses, the test DTC 702*t* may pass or fail the testing. To the extent that the test DTC 702*t* fails the testing, the first IC die 502 may undergo rework. The testing may for example, be or comprise WAT or the like.

Because the cap layer 102 is soft, the probe 1102 may be pushed through the cap layer 102 without damage. As such, no pad opening is formed in the cap layer 102 to expose the test interconnect pad 104*t* for testing. Because the test interconnect pad 104*t* is not exposed during testing, the test interconnect pad 104*t* is not subject to oxidation and electrical coupling between the test interconnect pad 104*t* and the probe 1102 is good. Further, because no pad opening is formed, the cost of a photolithography/etching process is saved and no etch damage (e.g., plasma induced etch damage) occurs to the test interconnect pad 104*t* and the test DTC 702*t*. Damage to the test DTC 702*t* may for example, increase leakage current.

Figure 12:
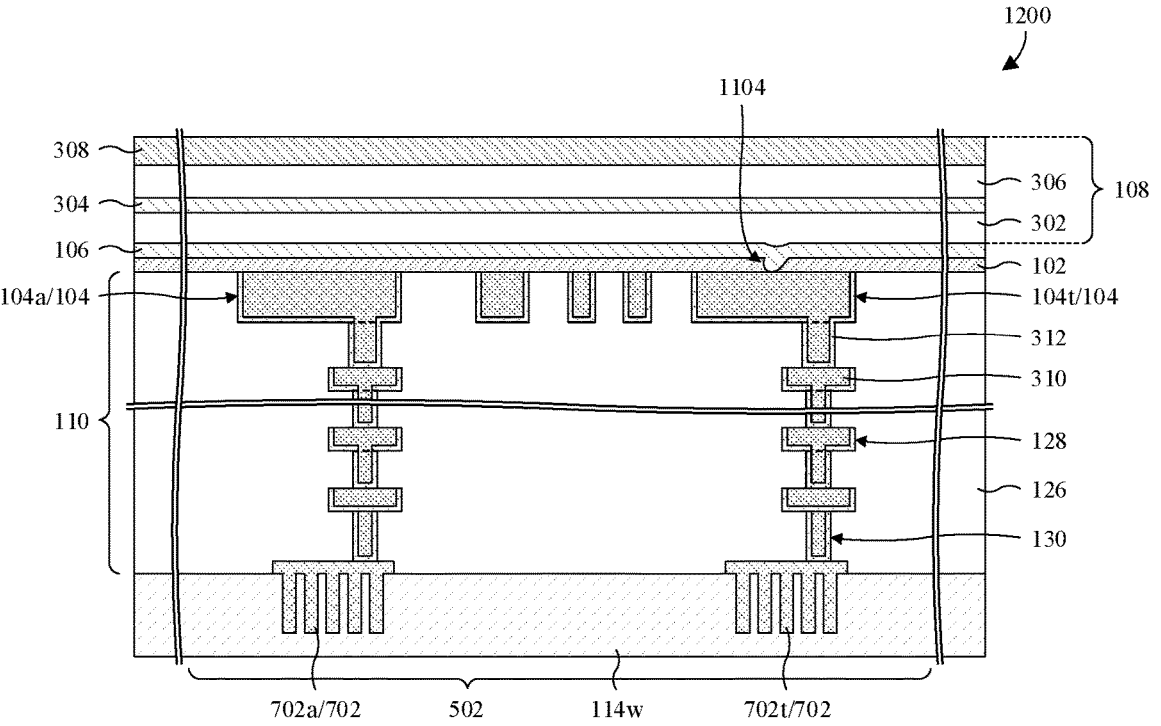

Focusing on FIG. 12, a first etch stop layer 106 is deposited over the cap layer 102 and filling the probe opening 1104 in the first etch stop layer 106. Further, a bond dielectric structure 108 is formed over the first etch stop layer 106. In alternative embodiments, the first etch stop layer 106 may be regarded as part of the bond dielectric structure 108 and/or the first etch stop layer 106 may be omitted. The first etch stop layer 106 may for example, be or comprise silicon nitride and/or some other suitable dielectric material(s). Further, the first etch stop layer 106 may for example, have a hardness greater than a hardness of the cap layer 102.

In some embodiments, the cap layer 102 is or comprises silicon carbon nitride or silicon carbide, and/or the etch stop layer 106 is or comprises silicon nitride. Other suitable materials are, however, amenable. The addition of carbon into silicon nitride reduces hardness, whereby silicon carbon nitride has a lesser hardness (e.g., is softer) than silicon nitride without any carbon.

The bond dielectric structure 108 comprises a first passivation layer 302, a second etch stop layer 304, a second passivation layer 306, and a bond dielectric layer 308 and is formed by sequentially depositing these layers. The first passivation layer 302 overlies the etch stop layer 106, the second etch stop layer 304 overlies the first passivation layer 302, the second passivation layer 306 overlies the second etch stop layer 304, and the bond dielectric layer 308 overlies the second passivation layer 306. The second etch stop layer 304 may for example, be or comprise a same dielectric material as the etch stop layer 106 and/or may for example, be or comprise silicon nitride and/or some other suitable dielectric(s). Further, the second etch stop layer 304 may for example, have a greater hardness than the cap layer 102 and/or may for example, have a same hardness as the etch stop layer 106.

Because the cap layer 102 is soft, no pad opening is formed in the cap layer 102 to expose the test interconnect pad 104*t* during the testing at FIG. 11 and hence no etch damage occurs to the test interconnect pad 104*t*. Because no etch damage occurs to the test interconnect pad 104*t*, and because there is no pad opening at the test interconnect pad 104*t*, the etch stop layer 106 and the bond dielectric structure 108 form with low topographical variation at the test interconnect pad 104*t*. For example, a top surface of the bond dielectric structure 108 may be flat. Further, the etch stop layer 106 and individual layers of the bond dielectric structure 108 may have individual thicknesses that are substantially uniform. While the probe 1102 of FIG. 11 forms the probe opening 1104 in the cap layer 102, the probe opening 1104 is small compared to a pad opening. As such, the probe opening 1104 has little effect on topographical variation.

Because there is no testing at the active interconnect pad 104*a*, and because there is no pad opening at the active interconnect pad 104*a*, the etch stop layer 106 and the bond dielectric structure 108 also form with low topographical variation at the active interconnect pad 104*a*. As a result, a top surface of the bond dielectric structure 108 may be flat. Further, the etch stop layer 106 and individual layers of the bond dielectric structure 108 may have individual thicknesses that are substantially uniform.

Figure 13:
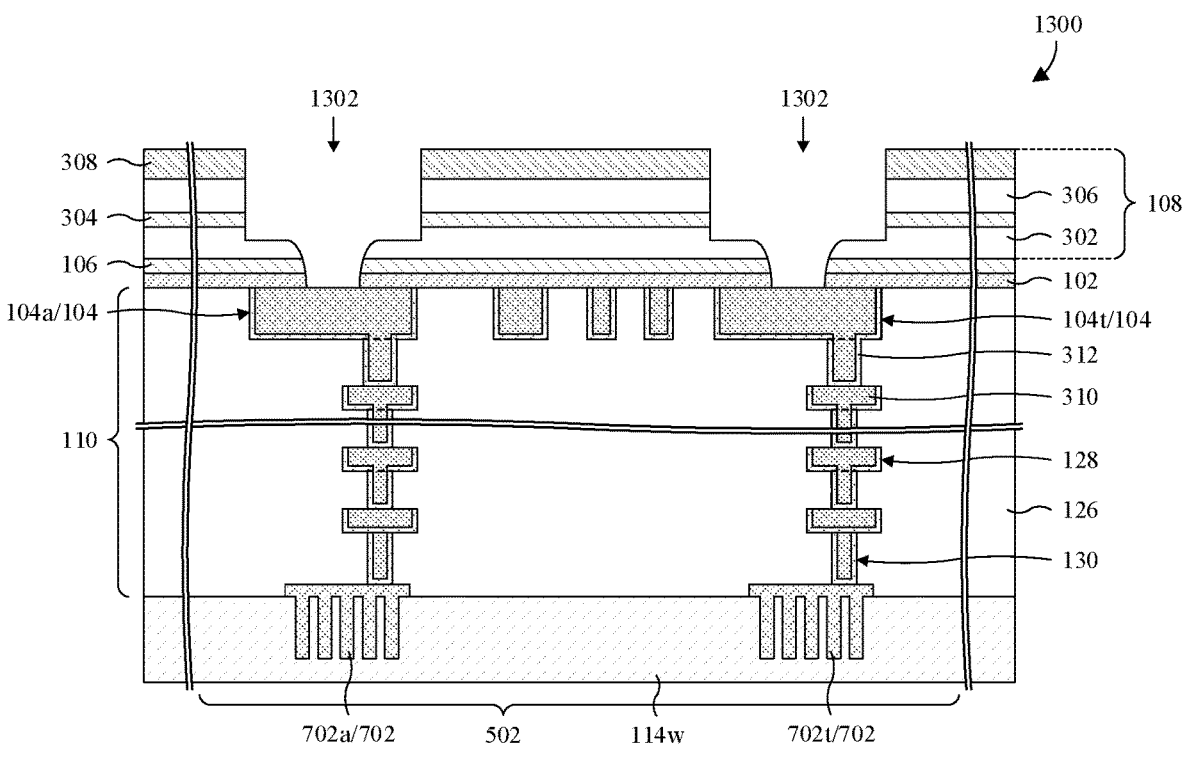

Focusing on FIG. 13, the cap layer 102, the etch stop layer 106, and the bond dielectric structure 108 are patterned to form openings 1302 individual to and respectively exposing the interconnect pads 104. The openings comprise lower portions corresponding to bond contacts being formed and further comprise upper portions corresponding to bond pads being formed. The patterning may for example, be performed by a photolithography/etching process or some other suitable patterning process.

In some embodiments, a process for forming the openings 1302 comprises performing a first photolithography/etching process to form the openings 1302 extending to the interconnect pads 104 and with individual widths corresponding to the bond contacts being formed. The etching of the first photolithography/etching process may for example, use the etch stop layer 106 and the cap layer 102 as an etch stop. After the first photolithography/etching process, the openings 1302 are filled with a masking material (e.g., photoresist or the like) and a second photolithography/etching process is performed to widen top portions of the openings 1302. The widening widens the openings 1302 to a width corresponding to the bond pads being formed. Further, the etching of the second photolithography/etching process may for example, use the second etch stop layer 304 as an etch stop.

Because the cap layer 102, the etch stop layer 106, and the bond dielectric structure 108 have low topographical variation at the interconnect pads 104, including at the test interconnect pad 104*t*, the patterning is well controlled. Because the patterning is well controlled, the openings 1302 form with uniform, well-controlled etch profiles. Further, the interconnect pads 104 are minimally damaged by etching during the patterning.

Figure 14:
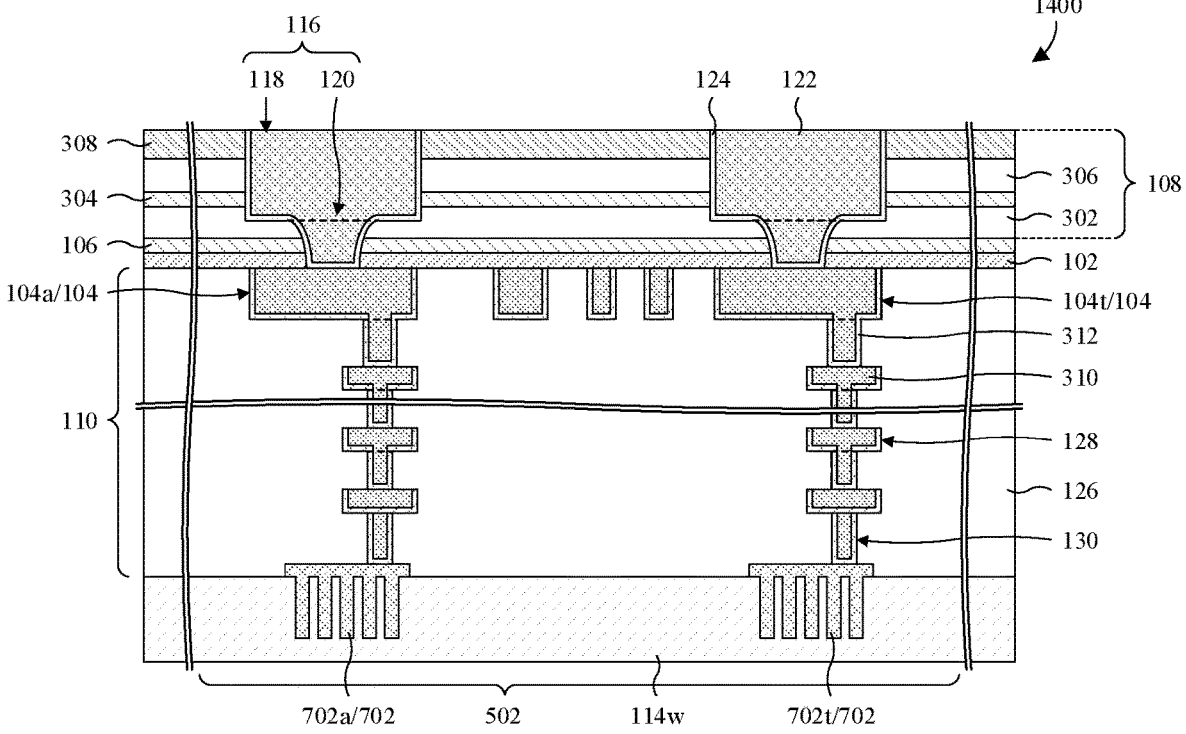

Focusing on FIG. 14, bond structures 116 individual to the openings 1302 are formed respectively in the openings 1302. The bond structures 116 comprise individual bond pads 118 and individual bond contacts 120. The bond pads 118 are at a top of the bond dielectric structure 108 and are recessed into the bond dielectric structure 108. Further, the bond pads 118 have top surfaces flush with a top surface of the bond dielectric structure 108. The bond contacts 120 extend respectively from the bond pads 118 respectively to the interconnect pads 104.

The bond structures 116 further comprise individual bond plugs 122 and individual bond barrier layers 124. The bond plugs 122 are paired respectively with the bond barrier layers 124, and each pair forms a corresponding bond pad and a corresponding bond contact. In alternative embodiments, the bond pads 118 are formed from separate bond plugs and bond barrier layers as the bond contacts 120. Further, in alternative embodiments, the bond barrier layers 124 are omitted. The bond barrier layers 124 are on (e.g., line) sidewalls and bottom surfaces of corresponding ones of the bond plugs 122 and are configured to prevent outward diffusion of conductive material from the bond plugs 122.

The bond structures 116 may for example, be formed by: 1) depositing a barrier layer lining the openings 1302; 2) depositing a conductive layer filling the openings 1302 over the barrier layer; and 3) performing a planarization into the barrier layer and the conductive layer so these layers have top surfaces flush with a top surface of the bond dielectric structure 108. The planarization may for example, be performed by a CMP or the like.

The barrier layer corresponds to the bond barrier layers 124 and is configured to block outward diffusion of material of the conductive layer. The barrier layer may for example, be or comprise tantalum, tantalum nitride, or some other suitable barrier material. The barrier layer may for example, be deposited by CVD, PVD, ALD, some other suitable deposition process(es), or any combination of the foregoing. The conductive layer corresponds to the bond plugs 122 and may for example, be or comprise copper and/or some other suitable metal(s). The conductive layer may for example, be deposited by electroless plating, CVD, PVD, ALD, some other suitable deposition process, or any combination of the foregoing.

Because the openings 1302 are formed with uniform, well-controlled etch profiles as described above, and because etch damage to the interconnect pads 104 is minimal as described above, conformality (e.g., thickness uniformity) of the bond barrier layers 124 is high. Further, the conductive layer deposits (e.g., by a plating process or the like) at a uniform rate across the openings 1302. Collectively, this leads to improved performance of the bond structures 116. For example, electromigration of material from the bond plugs 122 may be low because the bond barrier layers 124 have uniform thicknesses without thin spots. Further, RC delay for signals carried on the bond structures 116 may be low because the bond barrier layers 124 and the bond plugs 122 fill the openings 1302 without gaps and other defects.

Figure 15A:
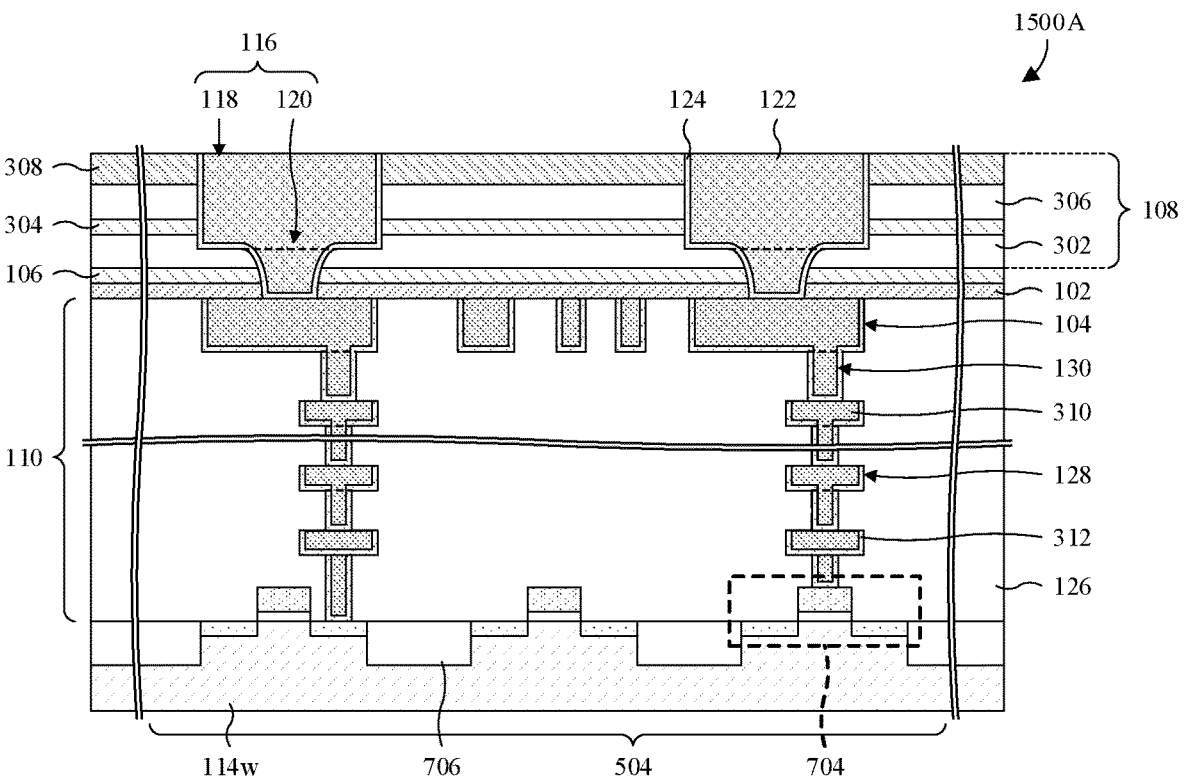
Figure 15B:
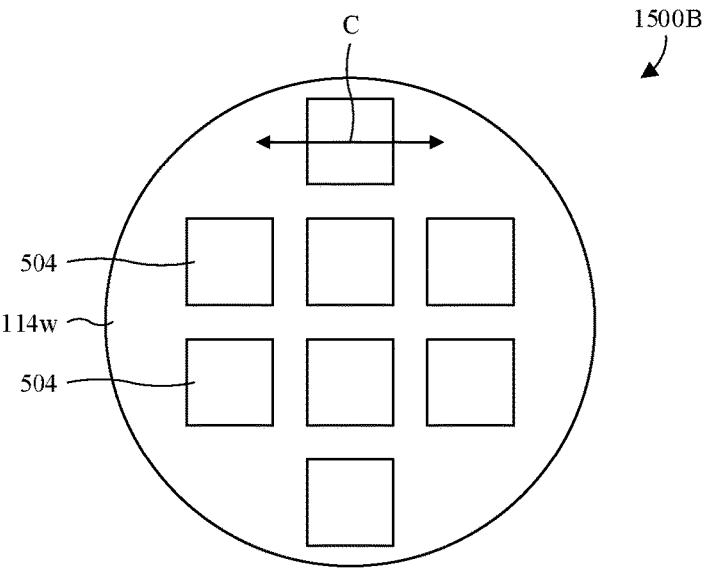

As illustrated by FIGS. 15A and 15B, the acts described with regard to FIGS. 8A and 8B to FIG. 14 are repeated to form a second IC die 504 repeating in a grid-shaped pattern across another wafer 114w. The other wafer 114w may for example, be a semiconductor wafer or the like and may for example, also be known as a second wafer, a second substrate, or the like. Further, the second IC die 504 is as first IC die 502 is described, except the interconnect structure 110 has a different layout and the DTCs 702 are replaced with transistors 704 separated from each other by trench isolation structure 706. In alternative embodiments, the second IC die 504 may be some other suitable IC die. FIG. 15B corresponds to a top layout view 1500B, whereas FIG. 15A corresponds to a cross-sectional view 1500A along line C in FIG. 15B.

Figure 16:
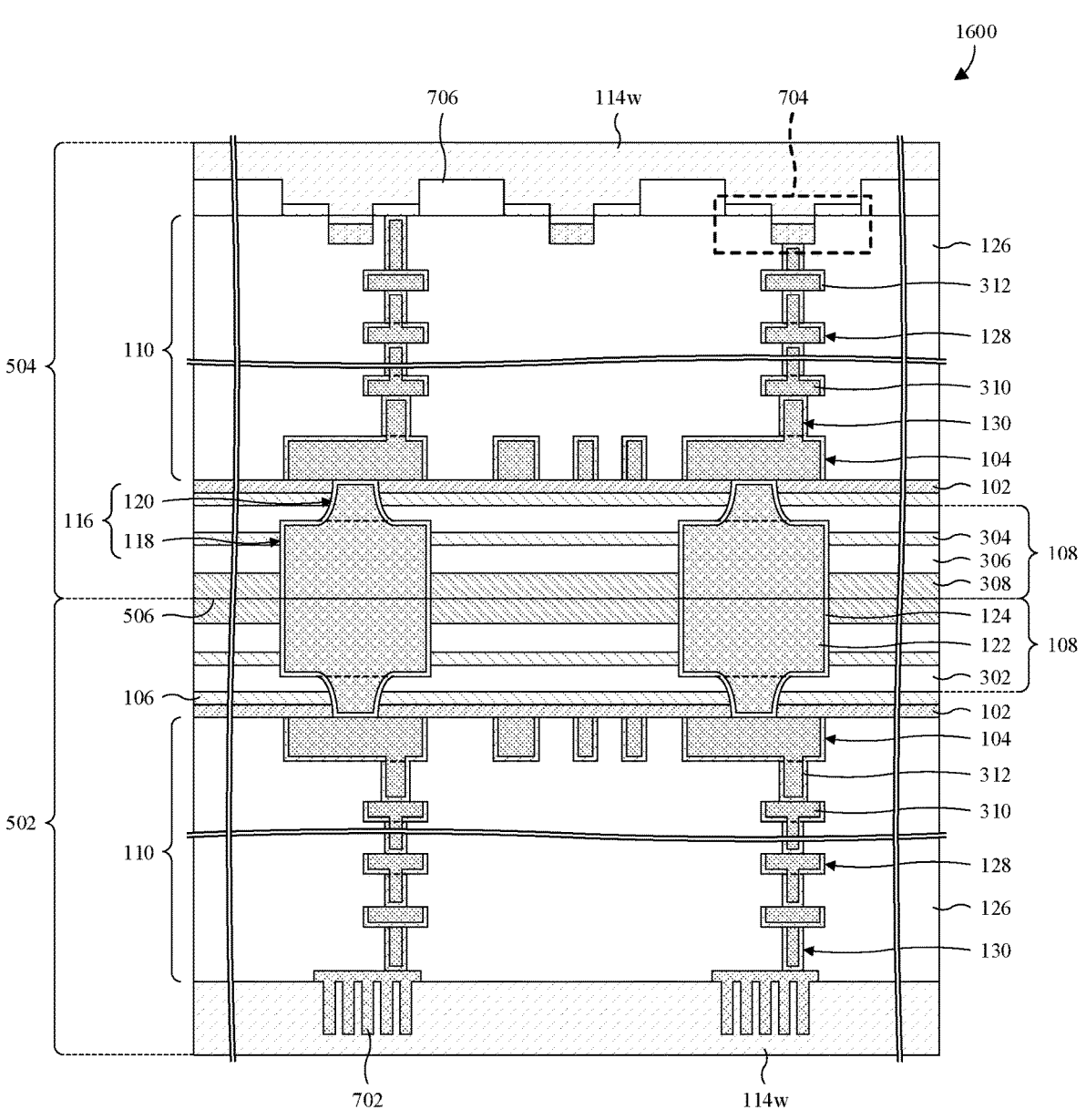

As illustrated by a cross-sectional view 1600 of FIG. 16, the first IC die 502 is hybrid bonded to the second IC die 504 at a bond interface 506, thereby forming a 3D IC. Hybrid bonding is bonding that comprises both metal-to-metal bonding and dielectric-to-dielectric bonding. The metal-to-metal bonding corresponds to bonding between the bond structures 116 of the first IC die 502 and the bond structures 116 of the second IC die 504. The dielectric-to-dielectric bonding corresponds to bonding between the bond dielectric structure 108 of the first IC die 502 and the bond dielectric structure 108 of the second IC die 504.

The hybrid bonding is performed at the wafer level, such that the hybrid bonding may be regarded as WoW hybrid bonding. In alternative embodiments, the wafer 114w of the first IC die 502 and/or the wafer 114w of the second IC die 504 undergo dicing before the hybrid bonding. If only one wafer undergoes dicing, the hybrid bonding may be regarded as die-on-wafer hybrid bonding. On the other hand, if both wafers undergo dicing, the hybrid bonding may be regarded as die-on-die hybrid bonding. Dicing dices a wafer to separate each instance of an IC die on the wafer from each other instance of the IC die.

Figure 17:
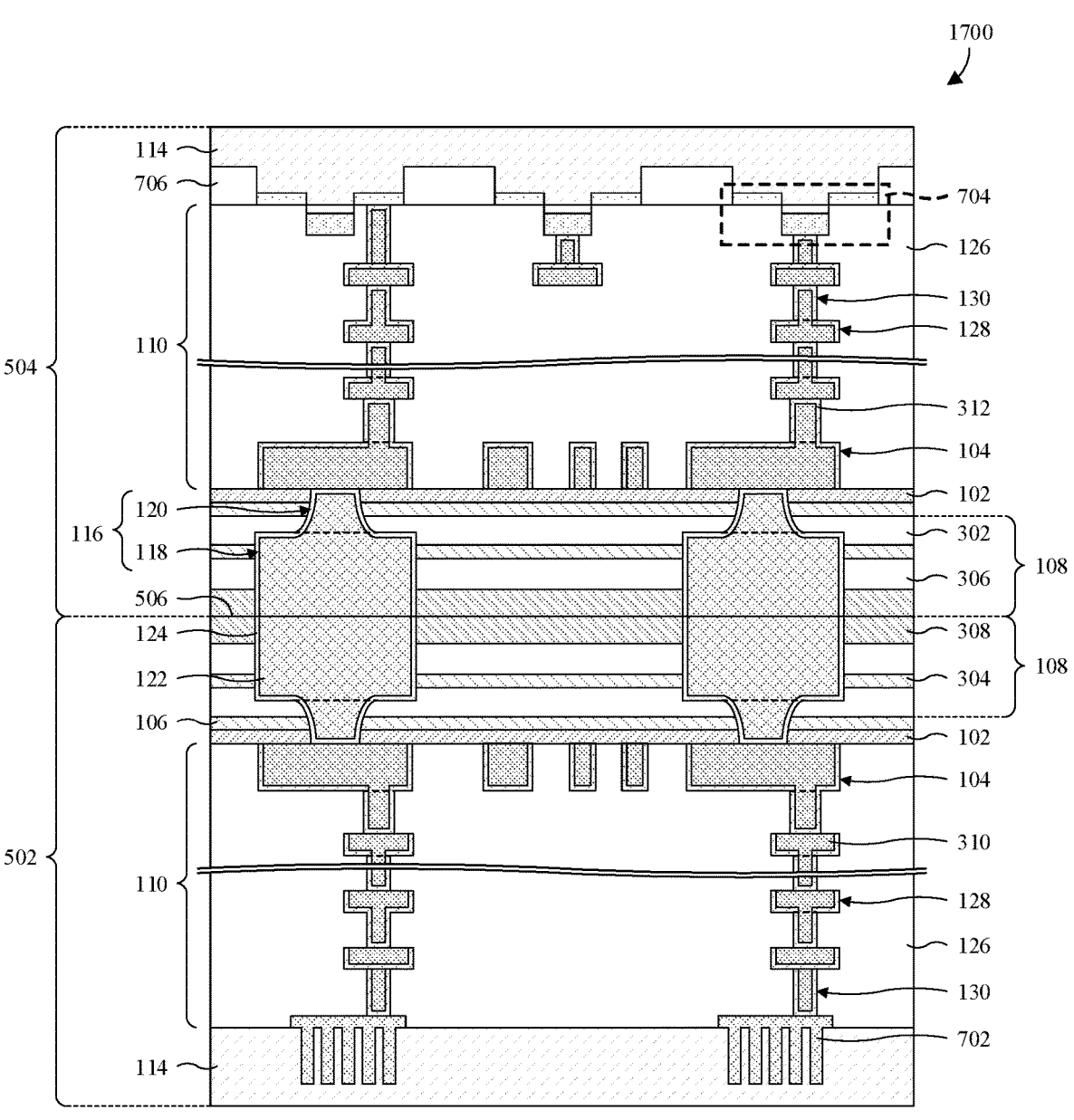

As illustrated by a cross-sectional view 1700 of FIG. 17, the wafers 114w of the first and second IC dies 502, 504 undergo dicing to separate each instance of the 3D IC from each other instance of the 3D IC. Further, the dicing segments the wafers 114w of the first and second IC dies 502, 504 into a plurality of individual substrates 114. The wafer 114w of the first IC die 502 is segmented into a plurality of substrates 114 individual to the 3D IC, and the wafer 114w of the second IC die 504 is segmented into a plurality of substrates 114 individual to the 3D IC. The dicing may for example, be performed by a die saw or the like.

While FIGS. 8A and 8B to FIG. 17 are described with reference to a method, it will be appreciated that the structures shown in these figures are not limited to the method but rather may stand alone separate of the method. While FIGS. 8A and 8B to FIG. 17 are described as a series of acts, it will be appreciated that the order of the acts may be altered in other embodiments. While FIGS. 8A and 8B to FIG. 17 illustrate and describe as a specific set of acts, some acts that are illustrated and/or described may be omitted in other embodiments. Further, acts that are not illustrated and/or described may be included in other embodiments.

With reference to FIG. 18, a block diagram 1800 of some embodiments of the method of FIGS. 8A and 8B to FIG. 17 is provided.

At act 1802, a first IC die is formed repeating across a first wafer. See, for example, FIGS. 8A and 8B to FIG. 14. Forming the first IC die comprises acts 1802a-1802g.

At act 1802a, a semiconductor device is formed on the first wafer. See, for example, FIGS. 8A and 8B.

At act 1802b, an interconnect structure is formed overlying the semiconductor device, wherein the interconnect structure comprises an interconnect pad at a top of the interconnect structure and electrically coupled to the semiconductor device. See, for example, FIG. 9.

At act 1802*c*, a cap layer is deposited overlying the interconnect structure, wherein the cap layer is configured to block oxidation of the interconnect pad and has a small hardness. The small hardness may for example, be a hardness less than a hardness of silicon nitride or the like and/or may for example, be a hardness equal to or less than a hardness of silicon carbide, silicon carbon nitride, or the like. See, for example, FIG. 10.

At act 1802*d*, testing is performed on the semiconductor device via the interconnect pad, wherein the testing comprises pushing a probe through the cap layer for electrical coupling to the interconnect pad. See, for example, FIG. 11.

At act 1802*e*, an etch stop layer and a bond dielectric structure are formed overlying the cap layer, wherein the etch stop layer has a greater hardness than the cap layer. See, for example, FIG. 12.

At act 1802*f*, the cap layer, the etch stop layer, and the bond dielectric structure are patterned to form an opening overlying and exposing the interconnect pad. See, for example, FIG. 13.

At act 1802*g*, a bond structure is formed in the opening, wherein the bond structure comprises a bond pad and a bond contact extending from the bond pad to the interconnect pad. See, for example, FIG. 14.

At act 1804, a second IC die is formed repeating across a second wafer. See, for example, FIGS. 15A and 15B. The forming of the second IC die may for example, comprise repeating acts 1802*a*-1802*g* on the second wafer.

At act 1806, the first IC die is hybrid bonded to the second IC via at a bond interface to form a 3D IC, wherein the hybrid bonding comprises metal-to-metal bonding and dielectric-to-dielectric bonding. See, for example, FIG. 16.

At act 1808, the first and second wafers are diced to separate instances of the 3D IC from each other. See, for example, FIG. 17.

While the block diagram 1800 of FIG. 18 is illustrated and described herein as a series of acts or events, it will be appreciated that the illustrated ordering of such acts or events is not to be interpreted in a limiting sense. For example, some acts may occur in different orders and/or concurrently with other acts or events apart from those illustrated and/or described herein. Further, not all illustrated acts may be required to implement one or more aspects or embodiments of the description herein, and one or more of the acts depicted herein may be carried out in one or more separate acts and/or phases.

In some embodiments, the present disclosure provides a semiconductor structure, including: a substrate; an interconnect structure overlying the substrate and including an interconnect pad at a top of the interconnect structure; a cap layer overlying the interconnect pad; an etch stop layer overlying the cap layer; and a bond structure overlying the interconnect structure and including a bond pad and a bond contact, wherein the bond contact extends through the etch stop layer and the cap layer from the bond pad to the interconnect pad; wherein a hardness of the cap layer is less than a hardness of the etch stop layer. In some embodiments, the cap layer is a dielectric layer including carbon. In some embodiments, the cap layer includes a silicon carbon layer. In some embodiments, the cap layer includes a silicon carbon nitride layer. In some embodiments, the cap layer includes silicon carbon nitride in which carbon has a non-zero atomic percentage greater than 60%. In some embodiments, the cap layer is amorphous. In some embodiments, the semiconductor structure further includes a bond dielectric structure overlying the etch stop layer, wherein the bond pad is recessed into a top of the bond dielectric structure and has a top surface flush with a top surface of the bond dielectric structure. In some embodiments, the substrate, the interconnect structure, the cap layer, the etch stop layer, and the bond structure form a first IC die, wherein the semiconductor structure includes a second IC die bonded to the first IC die through the bond structure.

In some embodiments, the present disclosure provides another semiconductor structure, including: a first IC die; and a second IC die bonded to the first IC die at a bond interface; wherein the first IC die includes an interconnect pad, a bond pad at the bond interface, a bond contact extending from the bond pad to a surface of the interconnect pad, and a cap layer covering the surface of the interconnect pad around the bond contact, and wherein the cap layer is a dielectric layer including carbon. In some embodiments, the cap layer includes a silicon carbon nitride layer. In some embodiments, the cap layer includes a silicon carbon layer. In some embodiments, the cap layer has a hardness less than a hardness of silicon nitride. In some embodiments, the cap layer has a non-zero atomic percentage of carbon greater than 60 percent. In some embodiments, the cap layer directly contacts the surface of the interconnect pad. In some embodiments, the second IC die includes a second interconnect pad, a second bond pad at the bond interface, a second bond contact extending from the second bond pad to a surface of the second interconnect pad, and a second cap layer directly on the surface of the second interconnect pad, wherein the cap layer and the second cap layer are a same material.

In some embodiments, the present disclosure provides a method for forming a semiconductor structure, including: forming a semiconductor device on a substrate; forming an interconnect structure over the substrate, wherein the interconnect structure includes an interconnect pad exposed at a top of the interconnect structure and electrically coupled to the semiconductor device; depositing a cap layer covering the interconnect pad; pushing a probe through the cap layer to the interconnect pad; performing a test on the semiconductor device via the probe and the interconnect pad; and forming a bond structure over and electrically coupled to the interconnect pad after the performing of the test. In some embodiments, the cap layer includes silicon carbon or silicon carbon nitrogen. In some embodiments, the substrate, the interconnect structure, and the bond structure form a first IC die, wherein the method further includes bonding the first IC die to a second IC die through the bond structure. In some embodiments, the forming of the interconnect structure includes: patterning a dielectric layer to form an opening corresponding to the interconnect pad; depositing a conductive layer in the opening; and performing a planarization into the conductive layer to form the interconnect pad. In some embodiments, the method further includes depositing an etch stop layer directly on the cap layer and having a greater hardness than the cap layer, wherein the bond structure is formed extending through the etch stop layer and the cap layer to the interconnect pad.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure, comprising:
a substrate;
an interconnect structure overlying the substrate and comprising an interconnect pad at a top of the interconnect structure;
a cap layer overlying the interconnect pad;
an etch stop layer overlying the cap layer; and
a bond structure overlying the interconnect structure and comprising a bond pad and a bond contact, wherein the bond contact extends through the etch stop layer and the cap layer from the bond pad to the interconnect pad;
wherein a hardness of the cap layer is less than a hardness of the etch stop layer.

2. The semiconductor structure according to claim 1, wherein the cap layer is a dielectric layer comprising carbon.

3. The semiconductor structure according to claim 1, wherein the cap layer comprises a silicon carbon layer.

4. The semiconductor structure according to claim 1, wherein the cap layer comprises silicon carbon nitride in which carbon has a non-zero atomic percentage greater than 60%.

5. The semiconductor structure according to claim 1, further comprising:
a bond dielectric structure overlying the etch stop layer, wherein the bond pad is recessed into a top of the bond dielectric structure and has a top surface flush with a top surface of the bond dielectric structure.

6. The semiconductor structure according to claim 1, wherein the substrate, the interconnect structure, the cap layer, the etch stop layer, and the bond structure form a first integrated circuit (IC) die, and wherein the semiconductor structure comprises:
a second IC die bonded to the first IC die through the bond structure.

7. A semiconductor structure, comprising:
a first integrated circuit (IC) die; and
a second IC die bonded to the first IC die at a bond interface;
wherein the first IC die comprises:
an interconnect pad;
a bond pad at the bond interface;
a bond contact extending from the bond pad to a surface of the interconnect pad;
a cap layer covering the surface of the interconnect pad around the bond contact; and
a dielectric layer separating the cap layer from the bond pad; and
wherein the cap layer is dielectric and comprises carbon, wherein a hardness of the cap layer is less than a hardness of the dielectric layer.

8. The semiconductor structure according to claim 7, wherein the cap layer comprises a silicon carbon nitride layer.

9. The semiconductor structure according to claim 7, wherein the hardness of the cap layer is less than a hardness of silicon nitride.

10. The semiconductor structure according to claim 7, wherein the cap layer has a non-zero atomic percentage of carbon greater than 60 percent.

11. The semiconductor structure according to claim 7, wherein the cap layer directly contacts the surface of the interconnect pad.

12. The semiconductor structure according to claim 7, wherein the second IC die comprises a second interconnect pad, a second bond pad at the bond interface, a second bond contact extending from the second bond pad to a surface of the second interconnect pad, and a second cap layer directly on the surface of the second interconnect pad, and wherein the cap layer and the second cap layer are a same material.

13. The semiconductor structure according to claim 7, wherein the cap layer is amorphous.

14. The semiconductor structure according to claim 7, wherein the hardness of the cap layer is less than about 9.0 on a Mohs scale.

15. The semiconductor structure according to claim 7, wherein the dielectric layer corresponds to an etch stop and is spaced from the bond pad.

16. A method for forming a semiconductor structure, comprising:
forming a semiconductor device on a substrate;
forming an interconnect structure over the substrate, wherein the interconnect structure comprises an interconnect pad exposed at a top of the interconnect structure and electrically coupled to the semiconductor device;
depositing a cap layer covering the interconnect pad;
pushing a probe through the cap layer to the interconnect pad;
performing a test on the semiconductor device via the probe and the interconnect pad; and
forming a bond structure over and electrically coupled to the interconnect pad after the performing of the test.

17. The method according to claim 16, wherein the cap layer comprises silicon carbon or silicon carbon nitrogen.

18. The method according to claim 16, wherein the substrate, the interconnect structure, and the bond structure form a first integrated circuit (IC) die, and wherein the method further comprises bonding the first IC die to a second IC die through the bond structure.

19. The method according to claim 16, wherein the forming of the interconnect structure comprises:
patterning a dielectric layer to form an opening corresponding to the interconnect pad;
depositing a conductive layer in the opening; and
performing a planarization into the conductive layer to form the interconnect pad.

20. The method according to claim 16, further comprising:
depositing an etch stop layer directly on the cap layer and having a greater hardness than the cap layer, wherein the bond structure is formed extending through the etch stop layer and the cap layer to the interconnect pad.

* * * * *